United States Patent
Soneda et al.

(10) Patent No.: US 11,276,773 B2
(45) Date of Patent: Mar. 15, 2022

(54) SEMICONDUCTOR DEVICE

(71) Applicant: Mitsubishi Electric Corporation, Tokyo (JP)

(72) Inventors: Shinya Soneda, Tokyo (JP); Kenji Harada, Tokyo (JP); Kakeru Otsuka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/950,047

(22) Filed: Nov. 17, 2020

(65) Prior Publication Data
US 2021/0265491 A1 Aug. 26, 2021

(30) Foreign Application Priority Data
Feb. 26, 2020 (JP) .............................. JP2020-030685

(51) Int. Cl.
*H01L 29/739* (2006.01)
*H01L 29/06* (2006.01)

(52) U.S. Cl.
CPC ...... *H01L 29/7397* (2013.01); *H01L 29/0607* (2013.01)

(58) Field of Classification Search
CPC . H01L 29/7397; H01L 29/0607; H01L 29/36; H01L 29/407; H01L 29/8613; H01L 29/0692
See application file for complete search history.

(56) References Cited

U.S. PATENT DOCUMENTS

2016/0351561 A1* 12/2016 Senoo ................. H01L 27/0727
2018/0138265 A1   5/2018 Soneda

FOREIGN PATENT DOCUMENTS

JP           2018-078230 A       5/2018

* cited by examiner

Primary Examiner — Syed I Gheyas
(74) Attorney, Agent, or Firm — Studebaker & Brackett PC

(57) ABSTRACT

A semiconductor device includes: first diode trench gates extending along a first main surface from a first end side of a cell region toward a second end side thereof opposite to the first end side, the first diode trench gates being disposed adjacent to each other at a first spacing; a boundary trench gate connected to end portions of the first diode trench gates and extending in a direction intersecting a direction of extension of the first diode trench gates; and second diode trench gates having end portions connected to the boundary trench gate and extending toward the second end side of the cell region.

9 Claims, 21 Drawing Sheets

SECTION B-B

F I G. 9
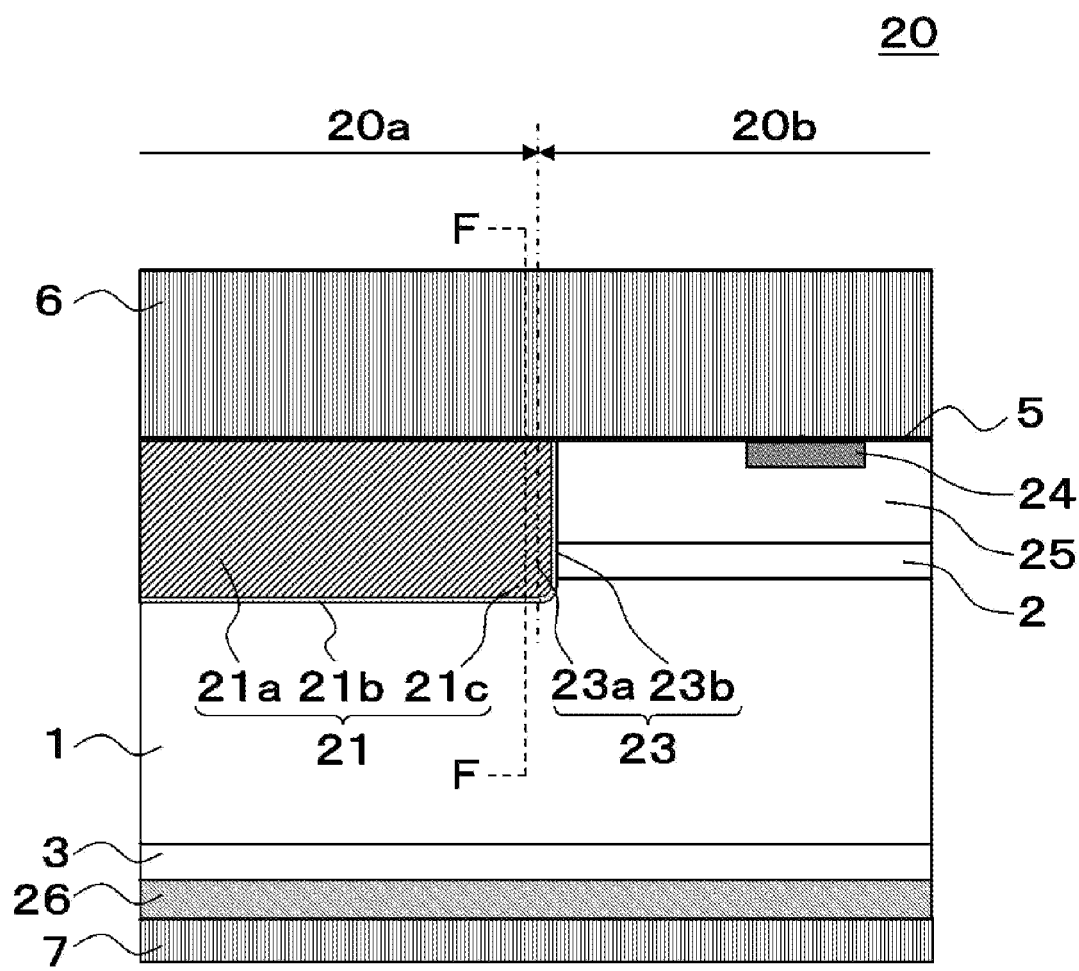

SEMICONDUCTOR DEVICE

BACKGROUND OF THE INVENTION

Field of the Invention

The present disclosure relates to a semiconductor device.

Description of the Background Art

An RC-IGBT (Reverse Conducting Insulated Gate Bipolar Transistor) in which an IGBT region and a diode region are provided in a single semiconductor device has been known. In the RC-IGBT, a termination region is provided in a peripheral portion of the semiconductor device to maintain the breakdown voltage of the semiconductor device, and the IGBT region and the diode region are provided in a cell region of the semiconductor device which is surrounded by the termination region. In the RC-IGBT, because a p type semiconductor layer is typically provided on the back surface side of an $n^-$ type drift layer in the termination region, an avalanche current is generated in the termination region, so that avalanche breakdown is liable to occur.

In a conventional semiconductor device, a high electric field cell region greater in trench-to-trench spacing than the diode region is provided in the diode region of the RC-IGBT having the IGBT region and the diode region. Thus, the conventional semiconductor device has an electric field strength higher in the high electric field cell region than in the IGBT region and the diode region to ensure avalanche breakdown resistance (as disclosed, for example, in Japanese Patent Application Laid-Open No. 2018-78230).

The high electric field cell region of the conventional semiconductor device has an anode layer and a cathode layer as in the diode region, and is similar in structure to the diode region except that the trench-to-trench spacing is different. When flowing in the semiconductor device that is the RC-IGBT, a return current flows in the diode region and the high electric field cell region. That is, the high electric field cell region operates as a diode, and the high electric field cell region is part of the diode region. In other words, the conventional semiconductor device is configured such that a first diode region in which first trench gates are disposed at a first spacing surrounds a second diode region (the high electric field cell region) in which second trench gates are disposed at a second spacing. The conventional semiconductor device employs such a configuration to ensure the avalanche breakdown resistance.

In the conventional semiconductor device, the first diode region and the second diode region are disposed adjacent to each other in the direction of extension of the trench gates. This results in a configuration in which the first trench gates disposed at the first spacing and the second trench gates disposed at the second spacing are disposed adjacent to each other in the direction of extension of the trench gates. Because of the difference in spacing between the trench gates, end portions of the trench gates are exposed in the $n^-$ type drift layer. Each of the trench gates has a configuration in which a trench electrode is provided in a trench formed in a semiconductor substrate, with an insulation film therebetween, so that the trench electrode is opposed to the $n^-$ type drift layer, with the insulation film therebetween. Because of such a configuration, an electric field is concentrated in the end portions of the first and second trench gates which are exposed in the $n^-$ type drift layer. This gives rise to a problem that the insulation films provided in the trenches deteriorate.

SUMMARY

It is therefore an object of the present disclosure to provide a semiconductor device that suppresses electric field concentration in end portions of first and second trench gates which are disposed adjacent to each other in the direction of extension of the trench gates and which are different in spacing from each other to suppress deterioration of insulation films formed in trenches.

A semiconductor device according to the present disclosure includes: a cell region including a drift layer of a first conductivity type provided between a first main surface and a second main surface opposite to the first main surface; and a termination region surrounding the cell region and including the drift layer between the first main surface and the second main surface. The semiconductor device further includes a plurality of first trench gates including a plurality of first trench electrodes provided in a plurality of first trenches, with an insulation film therebetween, in opposed relation to the drift layer, the first trenches being provided to extend along the first main surface from a first end side of the cell region toward a second end side thereof opposite to the first end side, the first trenches being disposed adjacent to each other at a first spacing. The semiconductor device further includes a boundary trench gate including a boundary trench electrode provided in a boundary trench, with an insulation film therebetween, in opposed relation to the drift layer, the boundary trench being provided to extend in a direction intersecting a direction of extension of the first trenches, the boundary trench being connected to end portions of the respective first trenches, the boundary trench electrode being electrically connected to the first trench electrodes. The semiconductor device further includes a plurality of second trench gates including a plurality of second trench electrodes provided in a plurality of second trenches, with an insulation film therebetween, in opposed relation to the drift layer, each of the second trenches having an end portion connected to the boundary trench, the second trenches being provided to extend toward the second end side of the cell region, the second trenches being disposed adjacent to each other at a second spacing different from the first spacing, the second trench electrodes being electrically connected to the boundary trench electrode.

According to the present disclosure, the semiconductor device suppresses electric field concentration in end portions of the first and second trench gates which are disposed adjacent to each other in the direction of extension of the trench gates and which are different in spacing from each other to suppress deterioration of the insulation film formed in the trenches.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 7 to 9 are sectional views showing the configuration of the diode region of the semiconductor device according to the first preferred embodiment;

DESCRIPTION OF THE PREFERRED EMBODIMENTS

First Preferred Embodiment

Figure 1:
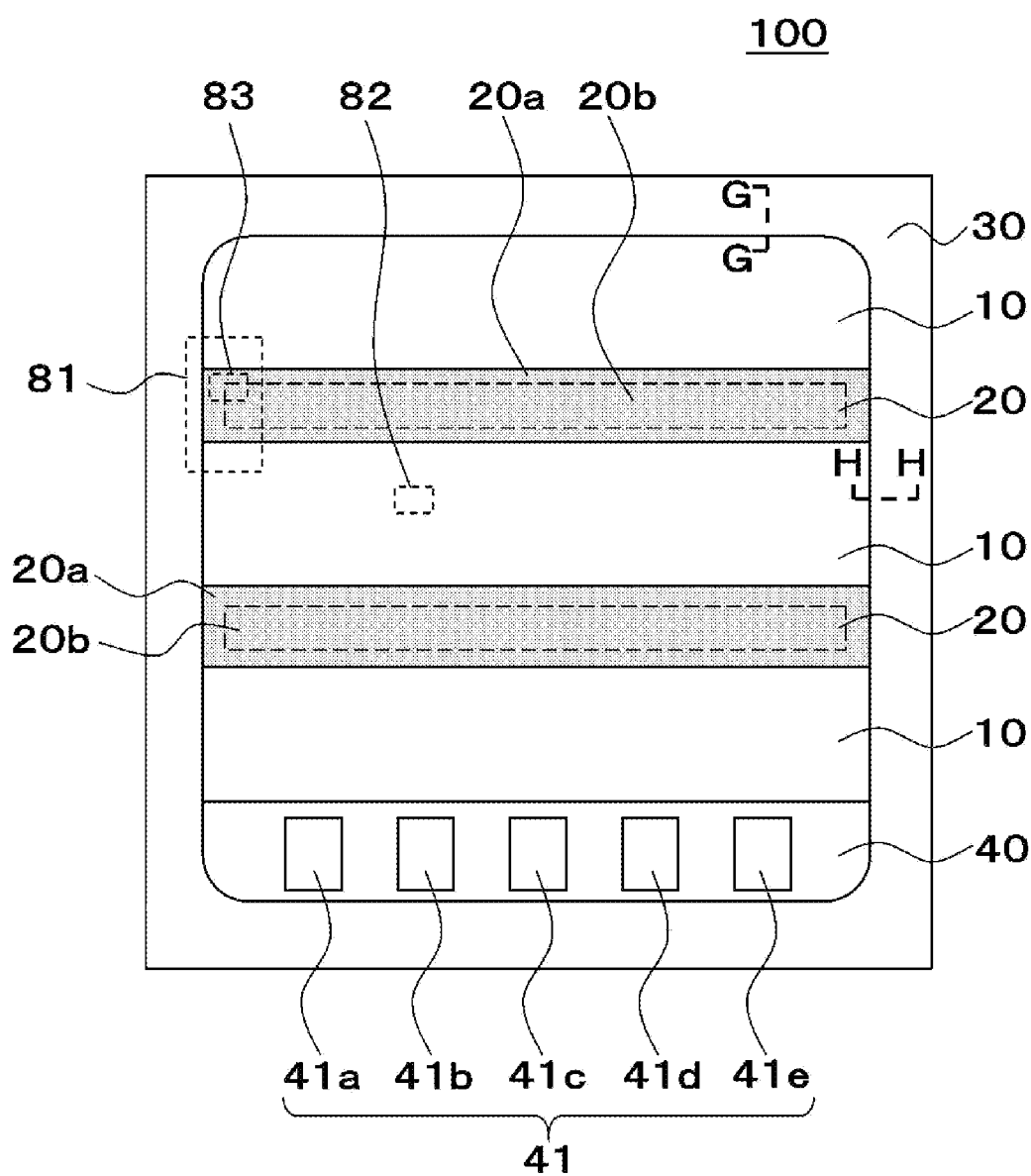
FIG. 1 is a plan view of a semiconductor device according to a first preferred embodiment.

First, a configuration of a semiconductor device 100 according to a first preferred embodiment will be described. FIG. 1 is a plan view of the semiconductor device 100 according to the first preferred embodiment.

In the following description, n and p denote semiconductor conductivity types. A first conductivity type and a second conductivity type will be defined as an n type and a p type, respectively, in the present invention. Also, $n^-$ indicates that the impurity concentration thereof is lower than that of n, and $n^+$ indicates that the impurity concentration thereof is higher than that of n. Similarly, $p^-$ indicates that the impurity concentration thereof is lower than that of p, and $p^+$ indicates that the impurity concentration thereof is higher than that of p.

With reference to FIG. 1, the semiconductor device 100 includes IGBT regions 10 and diode regions 20 in the single semiconductor device. The IGBT regions 10 and the diode regions 20 extend from a first end side to a second end side of the semiconductor device 100, and are disposed alternately in a striped pattern in a direction orthogonal to the direction of extension of the IGBT regions 10 and the diode regions 20. Three IGBT regions 10 and two diode regions 20 are shown in FIG. 1 in such a configuration that all of the diode regions 20 are sandwiched between the IGBT regions 10. However, the number of IGBT regions 10 and the number of diode regions 20 are not limited to these. The number of IGBT regions 10 may be either not less than three or not greater than three. The number of diode regions 20 may be either not less than two or not greater than two. Also, all of the IGBT regions 10 may be sandwiched between the diode regions 20. The IGBT regions 10 and the diode regions 20 may be disposed adjacent to each other one after another.

As shown in FIG. 1, a pad region 40 is disposed adjacent to the lower one of the IGBT regions 10 as seen in the figure. The pad region 40 is a region in which control pads 41 for controlling the semiconductor device 100 are provided. The IGBT regions 10, the diode regions 20, and the pad region 40 are collectively referred to as a cell region. A termination region 30 is provided around the cell region to maintain the breakdown voltage of the semiconductor device 100. A known breakdown voltage maintaining structure may be selectively provided, as appropriate, for the termination region 30. The breakdown voltage maintaining structure may be formed, for example, by providing an FLR (Field Limiting Ring) including $p^+$ type termination well layers made of a p type semiconductor and surrounding the cell region on a first main surface side that is a front surface side of the semiconductor device 100. The number of $p^+$ type termination well layers having a ring-shaped configuration used for the FLR may be selected, as appropriate, depending on the design of the breakdown voltage of the semiconductor device 100. Also, the $p^+$ type termination well layers may be provided entirely in the pad region 40. IGBT cells and diode cells may be provided in the pad region 40.

The control pads 41 may include a current sense pad 41a, a Kelvin emitter pad 41b, a gate pad 41c, and temperature sense diode pads 41d and 41e, for example. The current sense pad 41a is a control pad for sensing the current flowing through the cell region of the semiconductor device 100. The current sense pad 41a is a control pad electrically connected to part of the IGBT cells or diode cells of the cell region so that a current that is several times to tens of thousands of times smaller than the current flowing through the entire cell region flows when current flows through the cell region of the semiconductor device 100.

The Kelvin emitter pad 41b and the gate pad 41c are control pads to which a gate driving voltage for on/off controlling the semiconductor device 100 is applied. The Kelvin emitter pad 41b is electrically connected to a p type base layer of the IGBT cells, and the gate pad 41c is electrically connected to gate trench electrodes of the IGBT cells. The Kelvin emitter pad 41b and the p type base layer may be electrically connected to each other through a $p^+$ type contact layer. The temperature sense diode pads 41d and 41e are control pads electrically connected to an anode and a cathode of a temperature sense diode provided in the semiconductor device 100. The temperature sense diode pads 41d and 41e measure the voltage between the anode and the cathode of the temperature sense diode (not shown) provided in the cell region to measure the temperature of the semiconductor device 100.

As shown in FIG. 1, each of the diode regions 20 includes a first diode region 20a and a second diode region 20b. The first diode region 20a is provided so as to surround the second diode region 20b. In other words, the first diode region 20a is provided adjacent to the outer periphery of the second diode region 20b.

Figure 2:
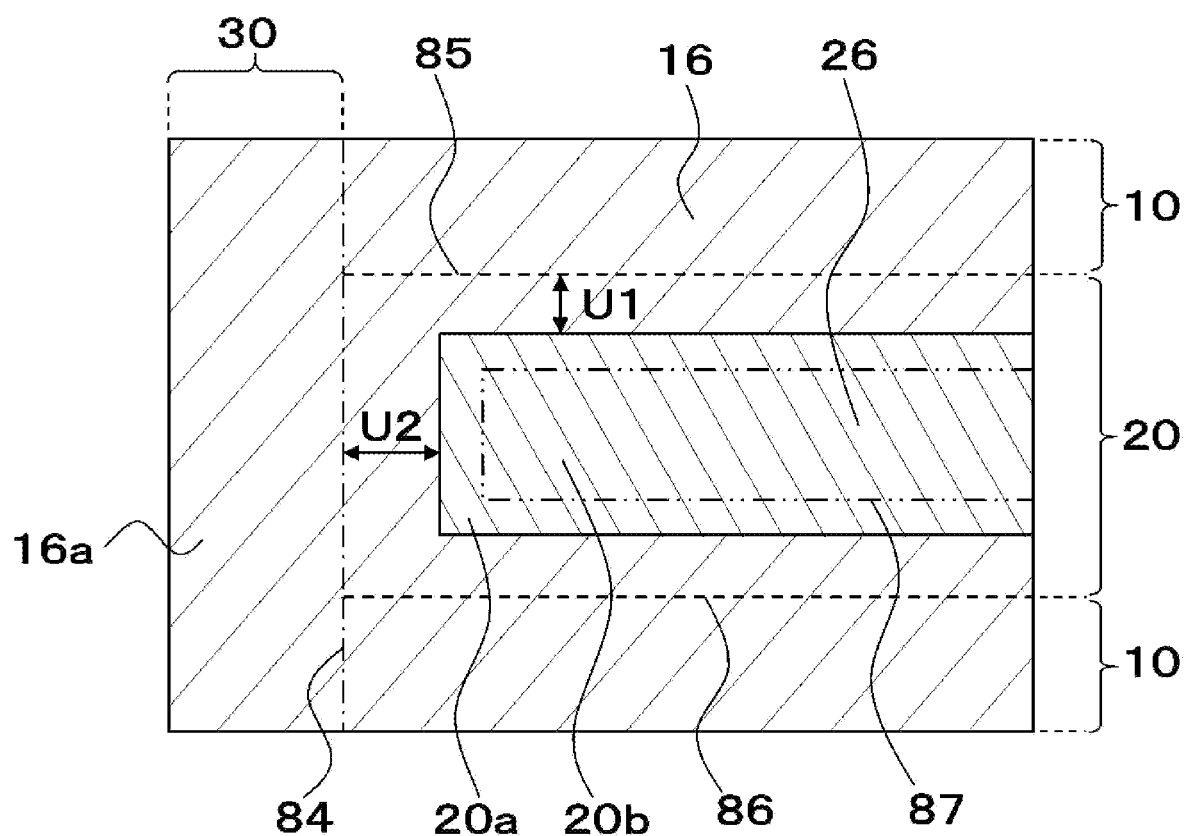
FIG. 2 is a partially enlarged plan view showing a configuration of a partial region of the semiconductor device according to the first preferred embodiment.

FIG. 2 is a partially enlarged plan view showing a configuration of a partial region of the semiconductor device 100 according to the first preferred embodiment. FIG. 2 is a plan view showing a region surrounded by broken lines 81 in the semiconductor device 100 shown in FIG. 1 on an enlarged scale, and is an enlarged view of a boundary portion between the IGBT regions 10, one of the diode regions 20, and the termination region 30.

With reference to FIG. 2, a region shown to the left of a dash-dot line 84 as seen in the figure is the termination region 30. In a region shown to the right of the dash-dot line 84 as seen in the figure, a region shown above a broken line 85 as seen in the figure and a region shown below a broken line 86 as seen in the figure are the IGBT regions 10, and a region between the broken line 85 and the broken line 86 is the one diode region 20. In the diode region 20, a region surrounded by dash-double-dot lines 87 is the second diode region 20b. The region of the diode region 20 except for the second diode region 20b is the first diode region 20a.

With reference to FIG. 2, a region shaded with diagonal lines extending from bottom left to top right is a region where a $p^+$ type collector layer 16 is provided on a second main surface side that is the back surface side of the semiconductor device 100, and a region shaded with diagonal lines extending from top left to bottom right is a region where an $n^+$ type cathode layer 26 is provided on the second main surface side. In the present disclosure, the $p^+$ type collector layer 16 provided in the termination region 30 is referred to as a $p^+$ type termination collector layer 16a in some cases for the sake of distinction between part of the $p^+$ type collector layer 16 which is provided in the cell region and part of the $p^+$ type collector layer 16 which is provided in the termination region 30. The $p^+$ type termination collector layer 16a is formed integrally with the $p^+$ type collector layer 16 in the cell region in continuous fashion. P type impurities such as boron (B) are implanted through the back surface of a semiconductor substrate constituting the semiconductor device 100 and then diffused in the semiconductor substrate to form the $p^+$ type collector layer 16. N type impurities such as phosphorus (P) are implanted and then diffused in the semiconductor substrate to form the $n^+$ type cathode layer 26.

As shown in FIG. 2, the $p^+$ type collector layer 16 protrudes a distance U1 from the boundary between each of the IGBT regions 10 and the diode region 20 toward the diode region 20. The $p^+$ type collector layer 16 protrudes a distance U2 from the boundary between the termination region 30 and the diode region 20 toward the diode region 20.

That is, not only the $n^+$ type cathode layer 26 but also the $p^+$ type collector layer 16 is provided on the semiconductor substrate back surface side of the first diode region 20a. The $p^+$ type collector layer 16 need not always be provided on the semiconductor substrate back surface side of the first diode region 20a. It is however preferable that the $p^+$ type collector layer 16 is provided on the semiconductor substrate back surface side of the first diode region 20a, with the distances U1 and U2 set to 100 μm, for example. This restrains the IGBT regions 10 and the termination region 30 from operating as diodes to reduce recovery current.

On the other hand, only the $n^+$ type cathode layer 26 is provided on the semiconductor substrate back surface side of the second diode region 20b. The $p^+$ type collector layer 16 continuous from the IGBT regions 10 is not provided on the semiconductor substrate back surface side of the second diode region 20b. Although not shown, $p^+$ type cathode layers may be provided dispersedly in the region where the $n^+$ type cathode layer 26 is provided. Alternatively, $n^+$ type cathode layers 26 and $p^+$ type cathode layers may be disposed alternately in a striped pattern.

Figure 3:
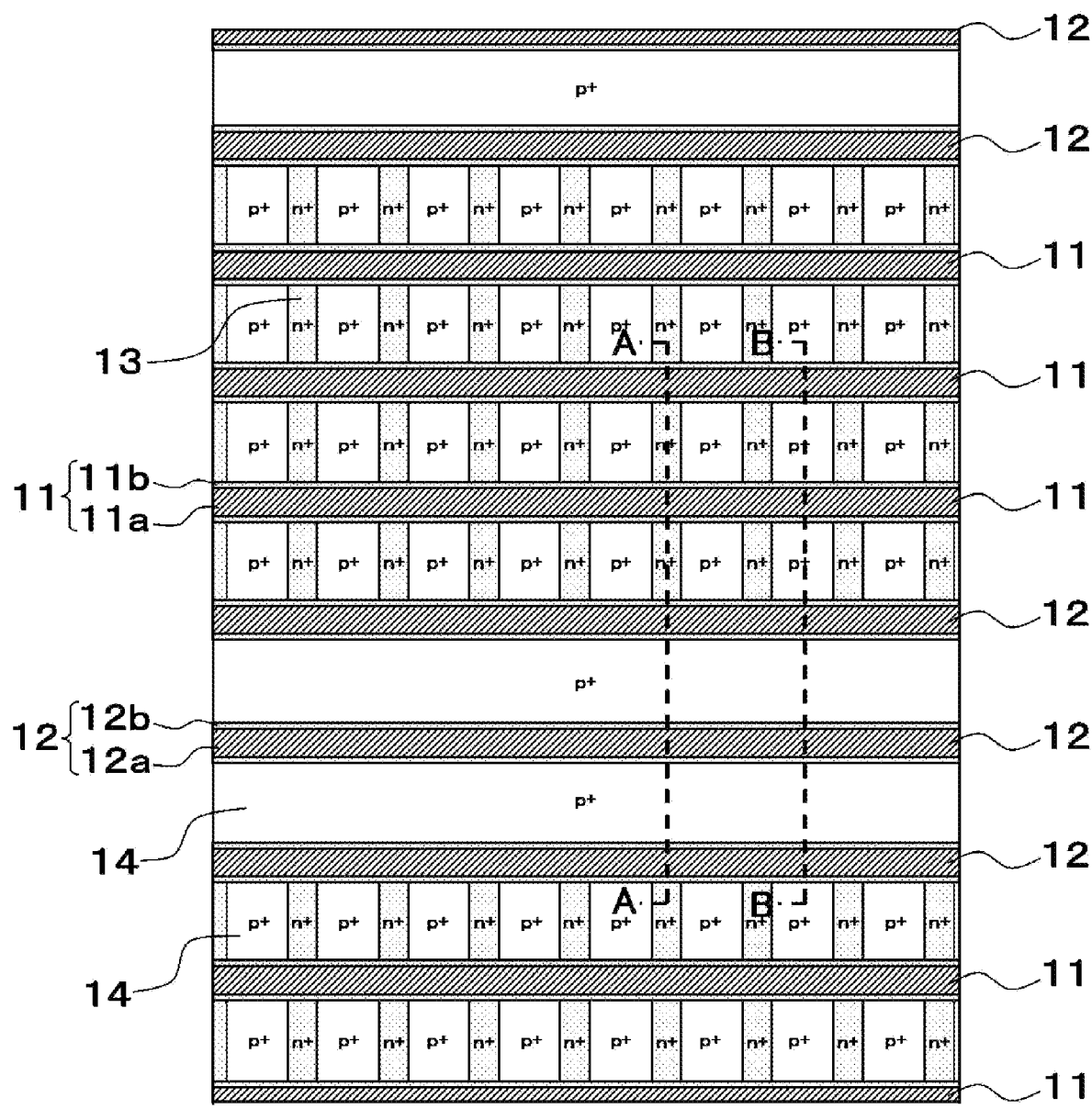
FIG. 3 is a partially enlarged plan view showing a configuration of an IGBT region of the semiconductor device according to the first preferred embodiment.
Figure 4:
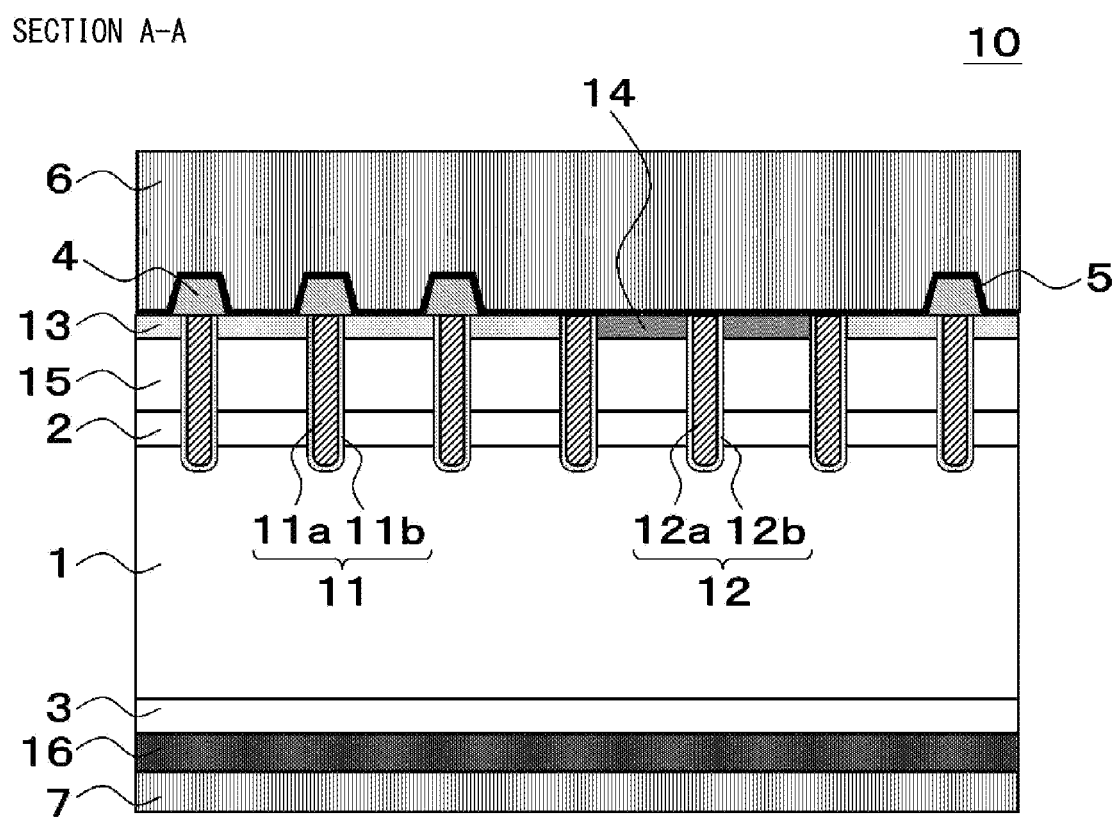
FIGS. 4 and 5 are sectional views showing the configuration of the IGBT region of the semiconductor device according to the first preferred embodiment.
Figure 5:
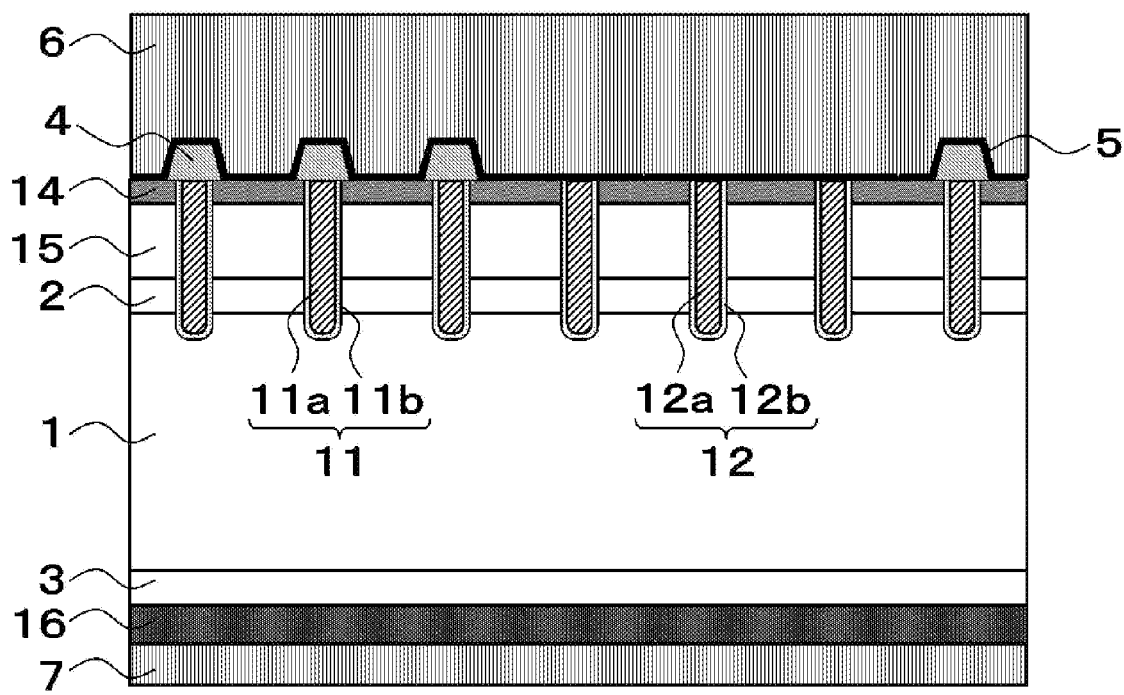

FIG. 3 is a partially enlarged plan view showing a configuration of an IGBT region 10 of the semiconductor device 100 according to the first preferred embodiment. FIGS. 4 and 5 are sectional views showing the configuration of the IGBT region 10 of the semiconductor device 100 according to the first preferred embodiment. FIG. 3 shows a region surrounded by broken lines 82 in the semiconductor device 100 shown in FIG. 1 on an enlarged scale. FIG. 4 is a sectional view of the semiconductor device 100 shown in FIG. 3 taken along a broken line A-A. FIG. 5 is a sectional view of the semiconductor device 100 shown in FIG. 3 taken along a broken line B-B.

In the IGBT region 10, active trench gates 11 and dummy trench gates 12 are disposed in a striped pattern, as shown in FIG. 3. In the semiconductor device 100 shown in FIG. 3, the active trench gates 11 and the dummy trench gates 12 extend in a longitudinal direction of the IGBT region 10, and the longitudinal direction of the IGBT region 10 becomes the longitudinal directions of the active trench gates 11 and the dummy trench gates 12. The active trench gates 11 and the dummy trench gates 12 extend from a first end side of the IGBT region 10 that is the cell region toward a second end side thereof opposite to the first end side.

Each of the active trench gates 11 is configured such that a gate trench electrode 11a is provided in a trench formed in the semiconductor substrate, with a gate trench insulation film 11b therebetween. Each of the dummy trench gates 12 is configured such that a dummy trench electrode 12a is provided in a trench formed in the semiconductor substrate, with a dummy trench insulation film 12b therebetween. The gate trench electrodes 11a of the active trench gates 11 are electrically connected to the gate pad 41c. The dummy trench electrodes 12a of the dummy trench gates 12 are electrically connected to an emitter electrode provided on the first main surface of the semiconductor device 100.

$N^+$ type source layers 13 are provided in contact with the gate trench insulation films 11b on opposite sides of the active trench gates 11 as seen in the width direction. The $n^+$ type source layers 13 alternate with $p^+$ type contact layers 14 in the direction of extension of the active trench gates 11. Some of the $p^+$ type contact layers 14 are also provided between adjacent two of the dummy trench gates 12.

As shown in FIG. 3, the IGBT region 10 of the semiconductor device 100 is configured such that three dummy trench gates 12 are arranged adjacent to three active trench gates 11 and such that three active trench gates 11 are arranged adjacent to three dummy trench gates 12. The IGBT region 10 of the semiconductor device 100 is configured such that sets of active trench gates 11 and sets of dummy trench gates 12 are arranged alternately in this manner. The number of active trench gates 11 included in one set of active trench gates 11 is three with reference to FIG. 3, but may be at least one. The number of dummy trench gates 12 included in one set of dummy trench gates 12 may be at least one. The number of dummy trench gates 12 may be zero. In other words, all of the trenches provided in the IGBT regions 10 may be the active trench gates 11.

FIG. 4 is a sectional view of the semiconductor device 100 taken along the broken line A-A of FIG. 3, and is a sectional view of the IGBT region 10. The semiconductor device 100 includes an $n^-$ type drift layer 1 formed from the semiconductor substrate. The semiconductor substrate in FIG. 4 ranges from the $n^+$ type source layers 13 and the $p^+$ type contact layers 14 to the $p^+$ type collector layer 16. With reference to FIG. 4, the upper end of the $n^+$ type source layers 13 and the $p^+$ type contact layers 14 as seen in the figure is referred to as a first main surface of the semiconductor substrate, and the lower end of the $p^+$ type collector layer 16 as seen in the figure is referred to as a second main surface of the semiconductor substrate. The first main surface of the semiconductor substrate is a main surface of the semiconductor device 100 on the front surface side, and the second main surface of the semiconductor device is a main surface of the semiconductor device 100 on the back surface side. The semiconductor device 100 includes the n⁻ type drift layer 1 between the first main surface and the second main surface opposite to the first main surface in the IGBT region 10 that is the cell region.

As shown in FIG. 4, an n type carrier storage layer 2 having an n type impurity concentration higher than that of the n⁻ type drift layer 1 is provided on the first main surface side of the n⁻ type drift layer 1 in the IGBT region 10. The semiconductor device 100 may be configured not to include the n type carrier storage layer 2 but to include the n⁻ type drift layer 1 provided also in the region of the n type carrier storage layer 2 shown in FIG. 4. The n type carrier storage layer 2 and the n⁻ type drift layer 1 together may be referred to as a drift layer.

A p type base layer 15 is provided on the first main surface side of the n type carrier storage layer 2. The p type base layer 15 is in contact with the gate trench insulation films 11b of the active trench gates 11. On the first main surface side of the p type base layer 15, the n⁺ type source layers 13 are provided in contact with the gate trench insulation films 11b of the active trench gates 11, and the p⁺ type contact layers 14 are provided in the remaining regions. The n⁺ type source layers 13 and the p⁺ type contact layers 14 constitute the first main surface of the semiconductor substrate. The p⁺ type contact layers 14 are regions having a p type impurity concentration higher than that of the p type base layer 15. The p⁺ type contact layers 14 and the p type base layer 15 may be referred to individually when it is necessary to make a distinction therebetween. The p⁺ type contact layers 14 and the p type base layer 15 together may be referred to as a p type base layer.

The semiconductor device 100 further includes an n type buffer layer 3 having an n type impurity concentration higher than that of the n⁻ type drift layer 1 and provided on the second main surface side of the type drift layer 1. The n type buffer layer 3 is provided to suppress the punch through of a depletion layer extending from the p type base layer 15 toward the second main surface side when the semiconductor device 100 is in an off state. The n type buffer layer 3 may be formed, for example, by implanting phosphorus (P) or protons (H⁺) or by implanting both phosphorus (P) and protons (H⁺). The semiconductor device 100 may be configured not to include the n type buffer layer 3 but to include the n⁻ type drift layer 1 provided also in the region of the n type buffer layer 3 shown in FIG. 4. The n type buffer layer 3 and the n⁻ type drift layer 1 together may be referred to as a drift layer.

The semiconductor device 100 includes the p⁺ type collector layer 16 on the second main surface side of the n type buffer layer 3. That is, the p⁺ type collector layer 16 is provided between the n⁻ type drift layer 1 and the second main surface. The p⁺ type collector layer 16 forms the second main surface of the semiconductor substrate. The p⁺ type collector layer 16 is provided not only in the IGBT regions 10 but also in the termination region 30. Part of the p⁺ type collector layer 16 provided in the termination region 30 forms the p⁺ type termination collector layer 16a. Also, the p⁺ type collector layer 16 may be provided in part of the diode regions 20, as mentioned above.

As shown in FIG. 4, the semiconductor device 100 includes trenches extending from the first main surface of the semiconductor substrate through the p type base layer 15 to the n⁻ type drift layer 1. The active trench gates 11 are formed by providing the gate trench electrodes 11a in the respective trenches, with the gate trench insulation films 11b therebetween. The gate trench electrodes 11a in the trench lower end portions are opposed to the n⁻ type drift layer 1, with the gate trench insulation films 11b therebetween. The dummy trench gates 12 are formed by providing the dummy trench electrodes 12a in the respective trenches, with the dummy trench insulation films 12b therebetween. The dummy trench electrodes 12a in the trench lower end portions are opposed to the n⁻ type drift layer 1, with the dummy trench insulation films 12b therebetween. The gate trench insulation films 11b of the active trench gates 11 are in contact with the p type base layer 15 and the n⁺ type source layers 13. When a gate drive voltage is applied to the gate trench electrodes 11a, a channel is formed in the p type base layer 15 in contact with the gate trench insulation films 11b of the active trench gates 11.

Interlayer insulation films 4 are provided on the gate trench electrodes 11a of the active trench gates 11, as shown in FIG. 4. A barrier metal 5 is formed on a region of the first main surface of the semiconductor substrate where the interlayer insulation films 4 are not formed and on the interlayer insulation films 4. The barrier metal 5 may be an electric conductor containing titanium (Ti), for example. Examples of the electric conductor may include titanium nitride and TiSi obtained by alloying titanium and silicon (Si). As shown in FIG. 4, the barrier metal 5 is in ohmic contact with the n⁺ type source layers 13, the p⁺ type contact layers 14, and the dummy trench electrodes 12a, and is electrically connected to the n⁺ type source layers 13, the p⁺ type contact layers 14, and the dummy trench electrodes 12a. An emitter electrode 6 is provided on the barrier metal 5. The emitter electrode 6 may be made of an aluminum alloy such as an aluminum-silicon alloy (Al—Si alloy). The emitter electrode 6 may be an electrode comprised of a plurality of metal films obtained by forming plating films by electroless plating or electroplating on an electrode made of an aluminum alloy. The plating films formed by electroless plating or electroplating may be nickel (Ni) plating films, for example. The n⁺ type source layers 13, the p⁺ type contact layers 14, and the dummy trench electrodes 12a may be in ohmic contact with the emitter electrode 6 without providing the barrier metal 5. The barrier metal 5 and the emitter electrode 6 together may be referred to as an emitter electrode.

A collector electrode 7 is provided on the second main surface side of the p⁺ type collector layer 16. Like the emitter electrode 6, the collector electrode 7 may be made of an aluminum alloy or formed by an aluminum alloy and a plating film. The collector electrode 7 may be different in configuration from the emitter electrode 6. The collector electrode 7 is in ohmic contact with the p⁺ type collector layer 16 and is electrically connected to the p⁺ type collector layer 16.

FIG. 5 is a sectional view of the semiconductor device 100 taken along the broken line B-B of FIG. 3, and is a sectional view of the IGBT region 10. The sectional view of FIG. 5 taken along the line B-B differs from the sectional view of FIG. 4 taken along the line A-A in that the n⁺ type source layers 13 provided in contact with the active trench gates 11 on the first main surface side of the semiconductor substrate are not seen. In other words, the n⁺ type source layers 13 are provided selectively on the first main surface side of the p type base layer, as shown in FIG. 3. The p type base layer termed herein is the p type base layer that is a collective designation of the p type base layer 15 and the p⁺ type contact layers 14.

Figure 6:
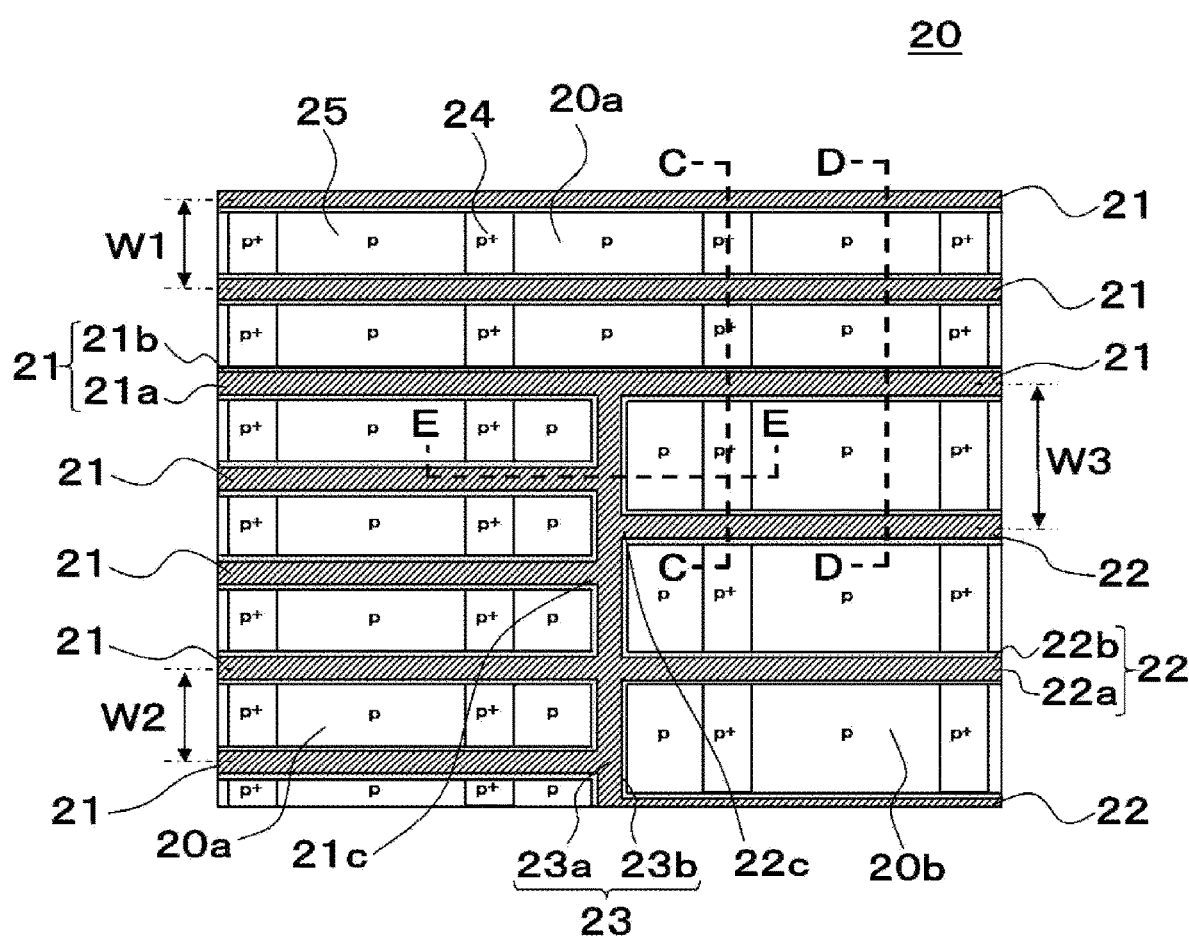
FIG. 6 is a partially enlarged plan view showing a configuration of a diode region of the semiconductor device according to the first preferred embodiment.
Figure 7:
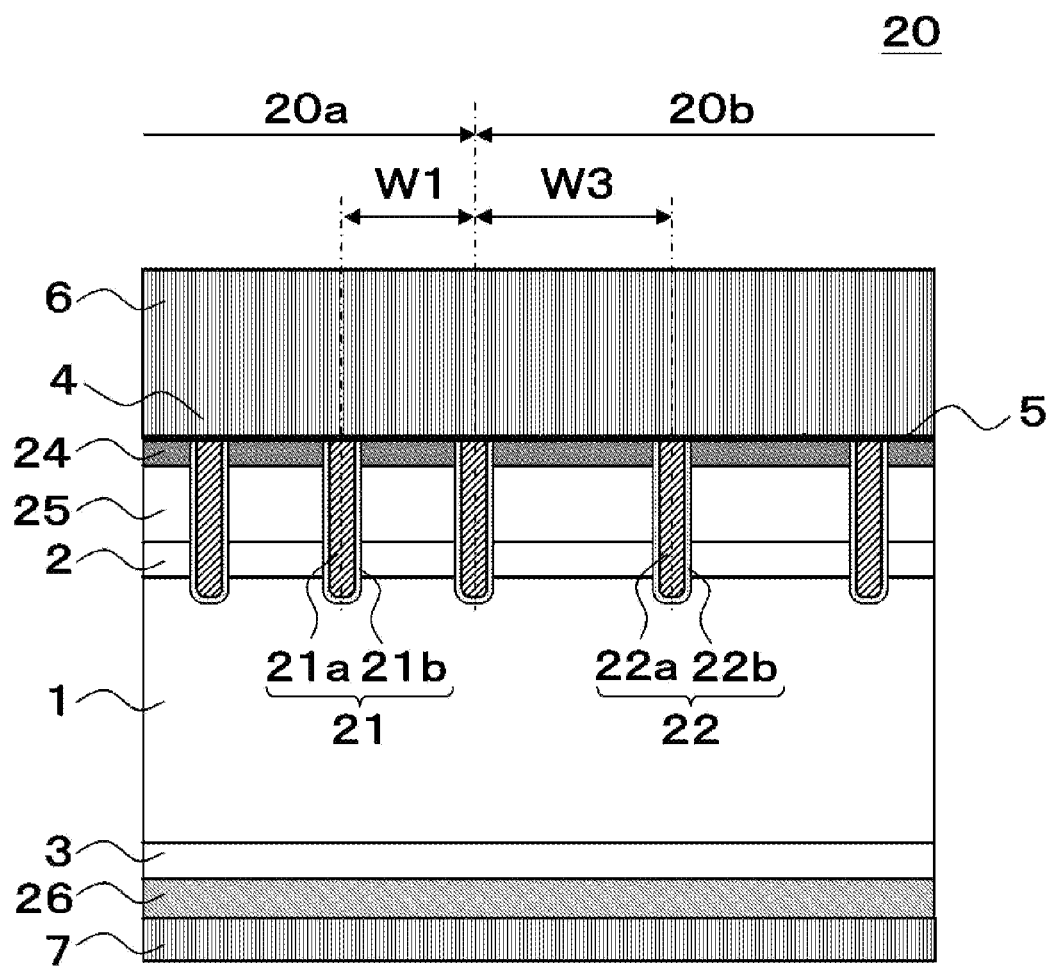
Figure 8:
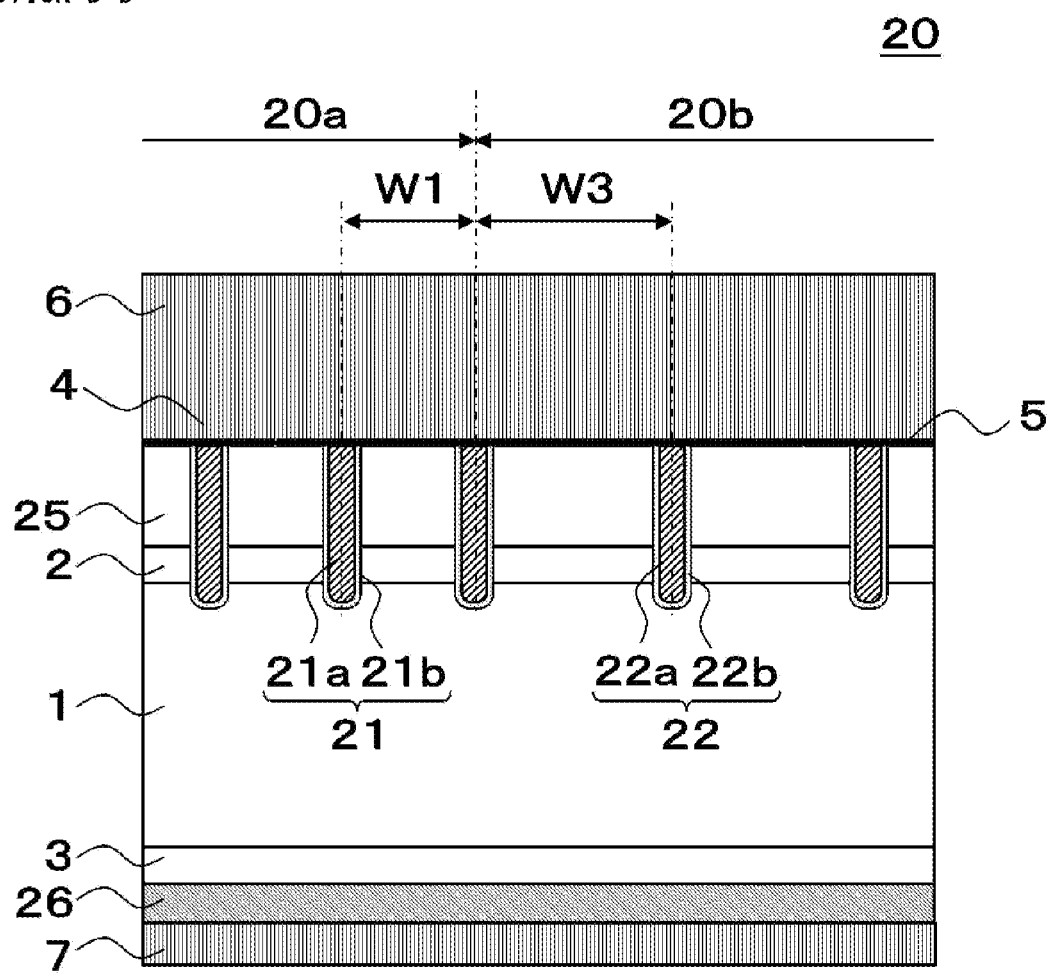

FIG. 6 is a partially enlarged plan view showing a configuration of a diode region 20 of the semiconductor device 100 according to the first preferred embodiment. FIGS. 7 to 9 are sectional views showing the configuration of the diode region 20 of the semiconductor device 100 according to the first preferred embodiment. FIG. 6 shows a region surrounded by broken lines 83 in the semiconductor device 100 shown in FIG. 1 on an enlarged scale. FIG. 7 is a sectional view of the semiconductor device 100 shown in FIG. 6 taken along a broken line C-C. FIG. 8 is a sectional view of the semiconductor device 100 shown in FIG. 6 taken along a broken line D-D. FIG. 9 is a sectional view of the semiconductor device 100 shown in FIG. 6 taken along a broken line E-E.

In the diode region 20, first diode trench gates 21 which are first trench gates in the first preferred embodiment are provided in the first diode region 20a, and second diode trench gates 22 which are second trench gates in the first preferred embodiment are provided in the second diode region 20b, as shown in FIG. 6. As shown in FIG. 1, the first diode region 20a is provided so as to surround the second diode region 20b.

As shown in FIG. 6, the first diode trench gates 21 and the second diode trench gates 22 are different in trench-to-trench spacing. The first diode trench gates 21 are disposed at a spacing W1 in a region where the second diode region 20b is absent in the longitudinal direction of the first diode trench gates 21, and are disposed at a spacing W2 in a region where the second diode region 20b is present in the longitudinal direction of the first diode trench gates 21. The spacing W1 and the spacing W2 are equal to each other in FIG. 6, but may be different from each other. The second diode trench gates 22 are disposed at a spacing W3. The spacing W3 between the second diode trench gates 22 is greater than the spacings W1 and W2 between the first diode trench gates 21. The spacing W1 and the spacing W2 may be 4 µm, for example. The spacing W3 may be 6 µm, for example.

As shown in FIG. 6, the first diode trench gates 21 disposed at the spacing W2 and the second diode trench gates 22 disposed at the spacing W3 do not extend from a first end to a second end of the diode region 20, but are divided in the longitudinal direction of the diode region 20. Thus, end portions 21c of the respective first diode trench gates 21 and end portions 22c of the respective second diode trench gates 22 are positioned inside the diode region 20, and are connected to a boundary trench gate 23.

As a result, this suppresses the concentration of an electric field in the end portions 21c of the first diode trench gates 21 and the end portions 22c of the second diode trench gates 22. The boundary trench gate 23 is a trench extending in a direction intersecting the longitudinal direction of the first diode trench gates 21 and the longitudinal direction of the second diode trench gates 22. Preferably, the longitudinal direction of the boundary trench gate 23 is orthogonal to the longitudinal direction of the first diode trench gates 21 and the longitudinal direction of the second diode trench gates 22.

The first diode trench gates 21 extends from a first end side of the diode region 20 that is the cell region toward a second end side thereof opposite to the first end side along the first main surface of the semiconductor device 100. Adjacent ones of the first diode trench gates 21 are disposed at the spacing W2 that is a first spacing. The boundary trench gate 23 is provided so as to extend in a direction intersecting the direction of extension of the first diode trench gates 21. The end portions 21c of the respective first diode trench gates 21 are connected to the boundary trench gate 23. The second diode trench gates 22 having the respective end portions 22c connected to the boundary trench gate 23 extend toward the second end side of the diode region 20 that is the cell region. Adjacent ones of the second diode trench gates 22 are disposed at the spacing W3 that is a second spacing.

Each of the first diode trench gates 21 is configured such that a first diode trench electrode 21a is provided in a trench formed in the semiconductor substrate in the first diode region 20a, with a first diode trench insulation film 21b therebetween. The first diode trench electrode 21a is opposed to the n⁻ type drift layer 1, with the first diode trench insulation film 21b therebetween. Each of the second diode trench gates 22 is configured such that a second diode trench electrode 22a is provided in a trench formed in the semiconductor substrate in the second diode region 20b, with a second diode trench insulation film 22b therebetween. The second diode trench electrode 22a is opposed to the n⁻ type drift layer 1, with the second diode trench insulation film 22b therebetween. The boundary trench gate 23 is configured such that a boundary trench electrode 23a is provided in a trench formed in the semiconductor substrate in a boundary portion between the first diode region 20a and the second diode region 20b, with a boundary trench insulation film 23b therebetween. The boundary trench electrode 23a is opposed to the n⁻ type drift layer 1, with the boundary trench insulation film 23b therebetween. The first diode trench electrodes 21a, the second diode trench electrodes 22a, and the boundary trench electrode 23a are electrically connected to each other.

As shown in FIG. 6, p⁺ type contact layers 24 and p type anode layers 25 are provided between adjacent two of the first diode trench gates 21, between adjacent two of the second diode trench gates 22 and between a first diode trench gate 21 and a second diode trench gate 22 adjacent to each other. The p⁺ type contact layers 24 and the p type anode layers 25 alternate with each other in the longitudinal directions of the first diode trench gates 21 and the second diode trench gates 22. The width of the p⁺ type contact layers 24 as seen in the longitudinal directions of the first diode trench gates 21 and the second diode trench gates 22 and the spacing between the p⁺ type contact layers 24 in the first diode region 20a are the same as those in the second diode region 20b. The width of the p⁺ type contact layers 24 as seen in the longitudinal directions of the first diode trench gates 21 and the second diode trench gates 22 may be 2 µm, for example. The spacing between the p⁺ type contact layers 24 may be 10 µm, for example.

FIG. 7 is a sectional view of the semiconductor device 100 taken along the broken line C-C of FIG. 6, and is a sectional view of the diode region 20. The semiconductor device 100 includes the n⁻ type drift layer 1 formed from the semiconductor substrate also in the diode region 20 as in the IGBT region 10. The n type drift layer 1 in the diode region 20 is formed integrally with the n⁻ type drift layer 1 in the IGBT region 10 in continuous fashion, and is formed from the same semiconductor substrate. The semiconductor substrate 100 in FIG. 7 ranges from the p⁺ type contact layers 24 to the n⁺ type cathode layer 26. With reference to FIG. 7, the upper end of the p⁺ type contact layers 24 as seen in the figure is referred to as the first main surface of the semiconductor substrate, and the lower end of the n⁺ type cathode layer 26 as seen in the figure is referred to as the second main surface of the semiconductor substrate. The first main surface of the diode region 20 and the first main surface of the IGBT region 10 are the same surface. The second main surface of the diode region 20 and the second main surface of the IGBT region 10 are the same surface.

Also in the diode region 20 as in the IGBT region 10, the n type carrier storage layer 2 is provided on the first main surface side of the n⁻ type drift layer 1, and the n type buffer layer 3 is provided on the second main surface side of the n⁻ type drift layer 1, as shown in FIG. 7. The n type carrier storage layer 2 and the n type buffer layer 3 provided in the diode region 20 are identical in configuration with those provided in the IGBT region 10. Even if the n type carrier storage layer 2 is provided in the IGBT region 10, the diode region 20 may be configured not to include the n type carrier storage layer 2. The n⁻ type drift layer 1, the n type carrier storage layer 2, and the n type buffer layer 3 together may be referred to as a drift layer, as in the IGBT region 10.

The p type anode layers 25 are provided on the first main surface side of the n type carrier storage layer 2. The p type anode layers 25 are provided between the n⁻ type drift layer 1 and the first main surface. The p type anode layers 25 may have the same p type impurity concentration as the p type base layer 15 in the IGBT region 10, and the p type anode layers 25 and the p type base layer 15 may be formed at the same time. Alternatively, the p type anode layers 25 may have a p type impurity concentration lower than that of the p type base layer 15 in the IGBT region 10, so that the amount of holes injected into the diode region 20 is reduced during diode operation. The reduction in the amount of holes injected during the diode operation reduces recovery losses during the diode operation.

The p⁺ type contact layers 24 are provided on the first main surface side of the p type anode layers 25. The p⁺ type contact layers 24 may have the same p type impurity concentration as the p⁺ type contact layers 14 in the IGBT region 10 or a p type impurity concentration different from that of the p⁺ type contact layers 14. The p⁺ type contact layers 24 constitute the first main surface of the semiconductor substrate. The p⁺ type contact layers 24 are regions having a p type impurity concentration higher than that of the p type anode layers 25. The p⁺ type contact layers 24 and the p type anode layers 25 may be referred to individually when it is necessary to make a distinction therebetween. The p⁺ type contact layers 24 and the p type anode layers 25 together may be referred to as a p type anode layer.

The n⁺ type cathode layer 26 is provided on the second main surface side of the n type buffer layer 3 in the diode region 20. The n⁺ type cathode layer 26 is provided between the n⁻ type drift layer 1 and the second main surface. As shown in FIG. 2, the n⁺ type cathode layer 26 is provided partially or entirely in the diode region 20. The n⁺ type cathode layer 26 constitutes the second main surface of the semiconductor substrate. Although not shown, p type impurities may be further selectively implanted in the region where the n⁺ type cathode layer 26 is formed as mentioned above to provide a p⁺ cathode layer so that part of the region where the n⁺ type cathode layer 26 becomes a p type semiconductor.

As shown in FIG. 7, the diode region 20 of the semiconductor device 100 includes trenches extending from the first main surface of the semiconductor substrate through the p type anode layers 25 to the n⁻ type drift layer 1. The trenches are disposed at the spacing W1 in the first diode region 20a, and disposed at the spacing W3 in the second diode region 20b. The first diode trench gates 21 are formed by providing the first diode trench electrodes 21a in the respective trenches in the first diode region 20a, with the first diode trench insulation films 21b therebetween. The first diode trench electrodes 21a are opposed to the n⁻ type drift layer 1, with the first diode trench insulation films 21b therebetween. The second diode trench gates 22 are formed by providing the second diode trench electrodes 22a in the respective trenches in the second diode region 20b, with the second diode trench insulation films 22b therebetween. The second diode trench electrodes 22a are opposed to the n⁻ type drift layer 1, with the second diode trench insulation films 22b therebetween.

As shown in FIG. 7, the barrier metal 5 is formed on the first diode trench electrodes 21a, the second diode trench electrodes 22a, and the p⁺ type contact layers 24. The barrier metal 5 is in ohmic contact with the first diode trench electrodes 21a, the second diode trench electrodes 22a, and the p⁺ type contact layers 24, and are electrically connected to the first diode trench electrodes 21a, the second diode trench electrodes 22a, and the p⁺ type contact layers 24. The barrier metal 5 may be identical in configuration with the barrier metal 5 in the IGBT region 10. The emitter electrode 6 is provided on the barrier metal 5. The emitter electrode 6 provided in the diode region 20 is formed continuously with the emitter electrode 6 provided in the IGBT region 10. The first diode trench electrodes 21a, the second diode trench electrodes 22a, and the p⁺ type contact layers 24 may be in ohmic contact with the emitter electrode 6 without providing the barrier metal 5, as in the case of the IGBT region 10.

The collector electrode 7 is provided on the second main surface side of the n⁺ type cathode layer 26. Like the emitter electrode 6, the collector electrode 7 provided in the diode region 20 is formed continuously with the collector electrode 7 provided in the IGBT region 10. The collector electrode 7 is in ohmic contact with the n⁺ type cathode layer 26 and is electrically connected to the n⁺ type cathode layer 26.

FIG. 8 is a sectional view of the semiconductor device 100 taken along the broken line D-D of FIG. 6, and is a sectional view of the diode region 20. The sectional view of FIG. 8 differs from the sectional view of FIG. 7 taken along the line C-C in that the p⁺ type contact layers 24 are not provided between the p type anode layers 25 and the barrier metal 5, so that the p type anode layers 25 constitute the first main surface of the semiconductor substrate. In other words, the p⁺ type contact layers 24 shown in FIG. 7 are selectively provided on the first main surface side of the p type anode layers 25.

FIG. 9 is a sectional view of the semiconductor device 100 taken along the broken line E-E of FIG. 6, and is a sectional view of the diode region 20. As shown in FIG. 6, the boundary trench gate 23 is provided in the boundary portion between the first diode region 20a and the second diode region 20b in a location where the second diode trench gates 22 are provided in the longitudinal direction of the first diode trench gates 21. The boundary trench gate 23 extends in a direction intersecting the direction of extension of the first diode trench gates 21 and the direction of extension of the second diode trench gates 22.

With reference to FIG. 9, the boundary trench gate 23 is provided to the right of a broken line F-F as seen in the figure. The boundary trench gate 23 is configured such that the boundary trench electrode 23a is provided in the trench formed in the semiconductor substrate in the boundary portion between the first diode region 20a and the second diode region 20b, with the boundary trench insulation film 23b therebetween. The boundary trench electrode 23a is opposed to the n⁻ type drift layer 1, with the boundary trench insulation film 23b therebetween. The barrier metal 5 is provided on the boundary trench electrode 23a. The boundary trench electrode 23a is in ohmic contact with the barrier metal 5, and is electrically connected to the barrier metal 5.

As shown in FIG. 9, the first diode trench electrode 21a of a first diode trench gate 21 and the boundary trench electrode 23a of the boundary trench gate 23 are formed integrally, and the first diode trench electrode 21a and the boundary trench electrode 23a are electrically connected to each other. Also, the first diode trench insulation film 21b and the boundary trench insulation film 23b are formed integrally. The end portion 21c of the first diode trench gate 21 is connected to the boundary trench gate 23. As a result, this suppresses the concentration of an electric field in the end portion 21c of the first diode trench gate 21 to suppress the deterioration of the first diode trench insulation film 21b provided in the end portion 21c of the first diode trench gate 21.

Although not shown, the end portion 22c of a second diode trench gate 22 in the boundary portion between the first diode region 20a and the second diode region 20b is also connected to the boundary trench gate 23. As a result, this suppresses the concentration of an electric field in the end portion 22c of the second diode trench gate 22 to suppress the deterioration of the second diode trench insulation film 22b provided in the end portion 22c of the second diode trench gate 22.

Figure 10A:
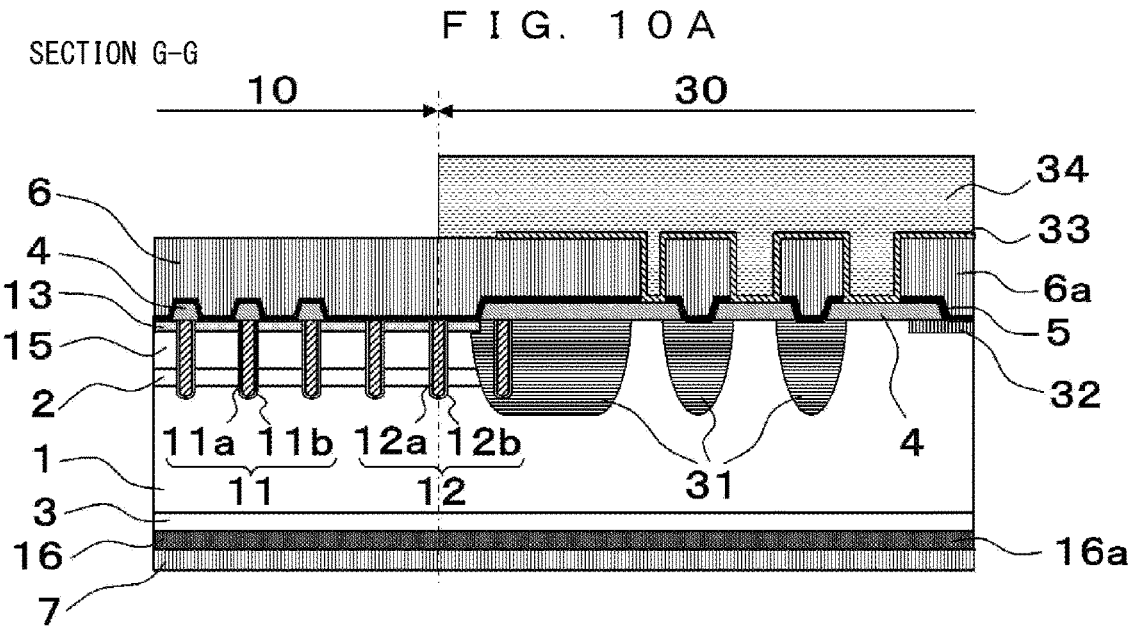
FIGS. 10A and 10B are sectional views showing a configuration of a termination region of the semiconductor device according to the first preferred embodiment.
Figure 10B:
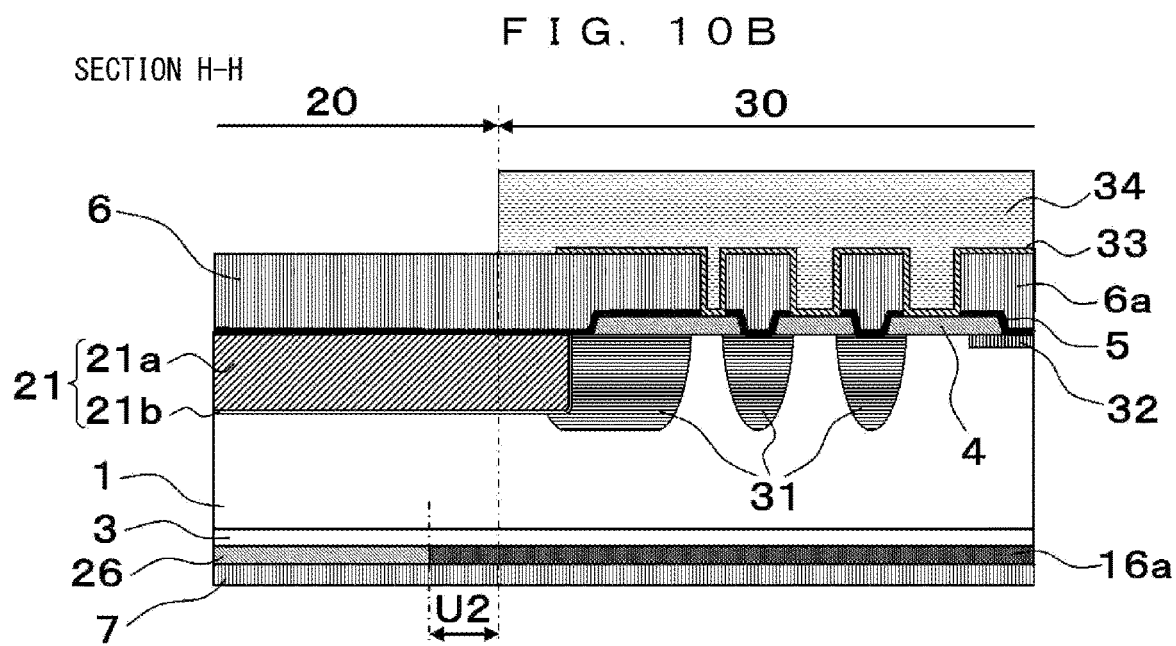

FIGS. 10A and 10B are sectional views showing a configuration of the termination region 30 of the semiconductor device 100 according to the first preferred embodiment. FIG. 10A is a sectional view taken along a broken line G-G of FIG. 1, and is a sectional view from an IGBT region 10 to the termination region 30. FIG. 10B is a sectional view taken along a broken line H-H of FIG. 1, and is a sectional view from a diode region 20 to the termination region 30.

As shown in FIGS. 10A and 10B, the termination region 30 of the semiconductor device 100 includes the n⁻ type drift layer 1 between the first main surface of the semiconductor substrate and the second main surface thereof. The first and second main surfaces of the termination region 30 are the same as those of the IGBT region 10 and the diode region 20. The n⁻ type drift layer 1 in the termination region 30 is identical in configuration with that in the IGBT region 10 and the diode region 20, and is formed integrally with that in the IGBT region 10 and the diode region 20 in continuous fashion.

P⁺ type termination well layers 31 are provided on the first main surface side of the n⁻ type drift layer 1, that is, between the first main surface of the semiconductor substrate and the n⁻ type drift layer 1. The p⁺ type termination well layers 31 are provided so as to surround the cell region including the IGBT regions 10 and the diode regions 20. The p⁺ type termination well layers 31 are in the form of a plurality of rings. The number of p⁺ type termination well layers 31 is selected, as appropriate, depending on the design of the breakdown voltage of the semiconductor device 100. An n⁺ type channel stopper layer 32 is provided on the outside of the p⁺ type termination well layers 31. The n⁺ type channel stopper layer 32 surrounds the p⁺ type termination well layers 31.

The p⁺ type termination collector layer 16a is provided between the n⁻ type drift layer 1 and the second main surface of the semiconductor substrate. The p⁺ type termination collector layer 16a is formed integrally with the p⁺ type collector layer 16 provided in the cell region in continuous fashion. Thus, the p⁺ type collector layer 16, including the p⁺ type termination collector layer 16a, may be referred to as the p⁺ type collector layer 16. As shown in FIG. 10B, an end portion of the p⁺ type termination collector layer 16a which is on the diode region 20 side protrudes the distance U2 toward the diode region 20. The provision of the p⁺ type termination collector layer 16a protruding toward the diode region 20 in this manner increases the distance between the n⁺ type cathode layer 26 in the diode region 20 and the p⁺ type termination well layers 31 to restrain the p⁺ type termination well layers 31 from operating as the anode of the diode.

The collector electrode 7 is provided on the second main surface of the semiconductor substrate. The collector electrode 7 is formed integrally in continuous fashion from the cell region including the IGBT regions 10 and the diode regions 20 to the termination region 30. The emitter electrode 6 continuous from the cell region and a termination electrode 6a separated from the emitter electrode 6 are provided on the first main surface of the semiconductor substrate in the termination region 30.

The emitter electrode 6 and the termination electrode 6a are electrically connected to each other through a semi-insulating film 33. The semi-insulating film 33 may be a film of sin-SiN (semi-insulating Silicon Nitride), for example. The termination electrode 6a is electrically connected to the p⁺ type termination well layers 31 and the n⁺ type channel stopper layer 32 through contact holes formed in the interlayer insulation films 4 provided on the first main surface in the termination region 30. A termination protective film 34 is provided in the termination region 30 so as to cover the emitter electrode 6, the termination electrode 6a, and the semi-insulating film 33. The termination protective film 34 may be made of polyimide, for example.

Next, a method of manufacturing the semiconductor device 100 according to the first preferred embodiment will be described.

FIGS. 11A, 11B, 12A, 12B, 13A, 13B, 14A, 14B, 15A, 15B, 16A and 16B are views showing a method of manufacturing the semiconductor device 100 according to the first preferred embodiment. FIGS. 11A, 11B, 12A, 12B, 13A, 13B, 14A and 14B are views showing the steps of forming the front surface side of the semiconductor device 100. FIGS. 15A, 15B, 16A and 16B are views showing the steps of forming the back surface side of the semiconductor device 100.

Figure 11A:
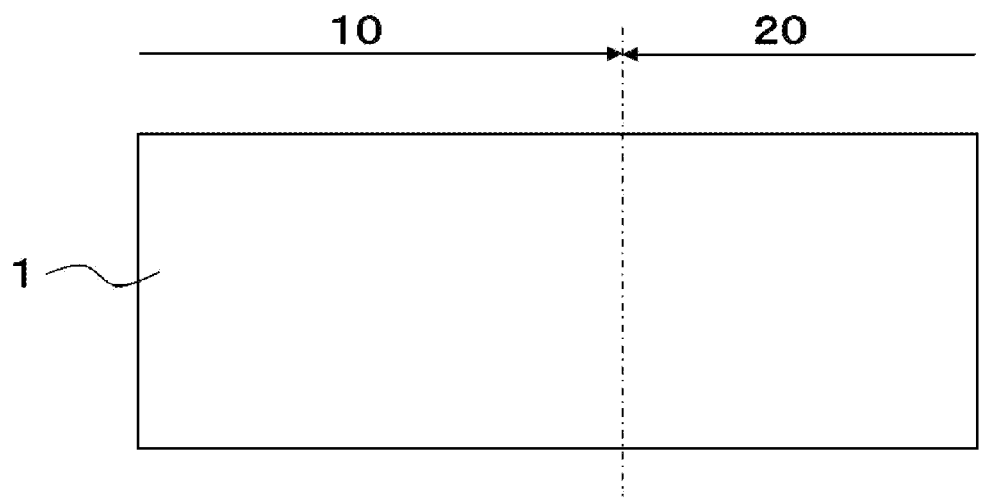
FIGS. 11A, 11B, 12A, 12B, 13A, 13B, 14A, 14B, 15A, 15B, 16A and 16B are views showing a method of manufacturing the semiconductor device according to the first preferred embodiment.

First, a semiconductor substrate constituting the n⁻ type drift layer 1 is prepared, as shown in FIG. 11A. A wafer known as an FZ wafer produced by an FZ (Floating Zone) method, for example, may be used for the semiconductor substrate. An n type wafer containing n type impurities may be used for the semiconductor substrate. The concentration of the n type impurities contained in the semiconductor substrate is selected, as appropriate, depending on the breakdown voltage of the semiconductor device to be produced. For a semiconductor device with a breakdown voltage of 1200 V, the n type impurity concentration is adjusted so that the resistivity of the n⁻ type drift layer 1 constituting the semiconductor substrate is on the order of 50 to 70Ω·cm. As shown in FIG. 11A, the entire semiconductor substrate is the n⁻ type drift layer 1 in the step of preparing the semiconductor substrate. P type or n type impurity ions are implanted from the first main surface side or the second main surface side of such a semiconductor substrate and are then diffused in the semiconductor substrate by heat treatment and the like to form p type or n type semiconductor layers, whereby the semiconductor device 100 is manufactured.

As shown in FIG. 11A, the semiconductor substrate constituting the n⁻ type drift layer 1 includes regions which become the IGBT region 10 and the diode region 20. Although not shown, the semiconductor substrate further includes a region which becomes the termination region 30 around the regions which become the IGBT region 10 and the diode region 20. A method of manufacturing the configuration of the IGBT region 10 and the diode region 20 of the semiconductor device 100 will be mainly described below. The termination region 30 of the semiconductor device 100 may be produced by a known manufacturing method. For example, an FLR having the $p^+$ type termination well layers 31 as a breakdown voltage maintaining structure in the termination region 30 as an example may be formed by implanting p type impurity ions before the processing of the IGBT region 10 and the diode region 20 of the semiconductor device 100 or by implanting p type impurity ions at the same time that ions of p type impurity are implanted into the IGBT region 10 and the diode region 20 of the semiconductor device 100.

Figure 11B:
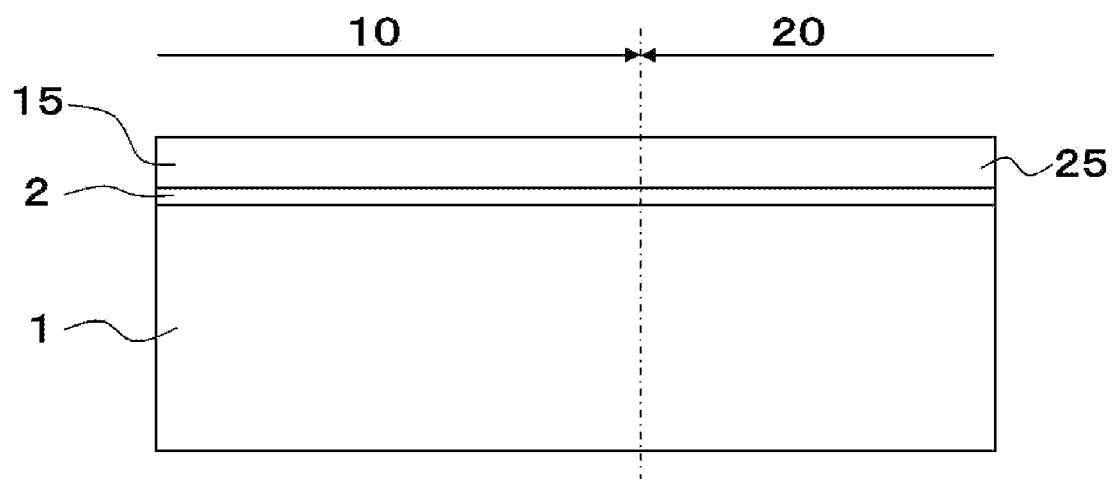

Next, as shown in FIG. 11B, n type impurities such as phosphorus (P) are implanted from the first main surface side of the semiconductor substrate to form the n type carrier storage layer 2. P type impurities such as boron (B) are implanted from the first main surface side of the semiconductor substrate to form the p type base layer 15 and the p type anode layer 25. The n type carrier storage layer 2, the p type base layer 15, and the p type anode layer 25 are formed by implanting impurity ions into the semiconductor substrate and then diffusing the impurity ions by heat treatment. The n type carrier storage layer 2, the p type base layer 15, and the p type anode layer 25 are selectively formed on the first main surface side of the semiconductor substrate because ions of n type impurities and p type impurities are implanted after a mask process is performed on the first main surface of the semiconductor substrate. The n type carrier storage layer 2, the p type base layer 15, and the p type anode layer 25 are formed in the IGBT region 10 and the diode region 20, and are connected to the $p^+$ type termination well layers 31 in the termination region 30. The mask process refers to the process of forming a mask on the semiconductor substrate for purposes of applying a resist on the semiconductor substrate, forming an opening in a predetermined region of the resist by photolithography, and implanting ions into the predetermined region of the semiconductor substrate through the opening or performing etching in the predetermined region.

The p type base layer 15 and the p type anode layer 25 may be formed by implanting ions of p type impurity at the same time. In this case, the p type base layer 15 and the p type anode layer 25 are identical in depth, in p type impurity concentration, and in configuration. Alternatively, the p type base layer 15 and the p type anode layer 25 may be made different from each other in depth and in p type impurity concentration by implanting ions of p type impurities at different times between the p type base layer 15 and the p type anode layer 25 by means of the mask process.

Figure 12A:
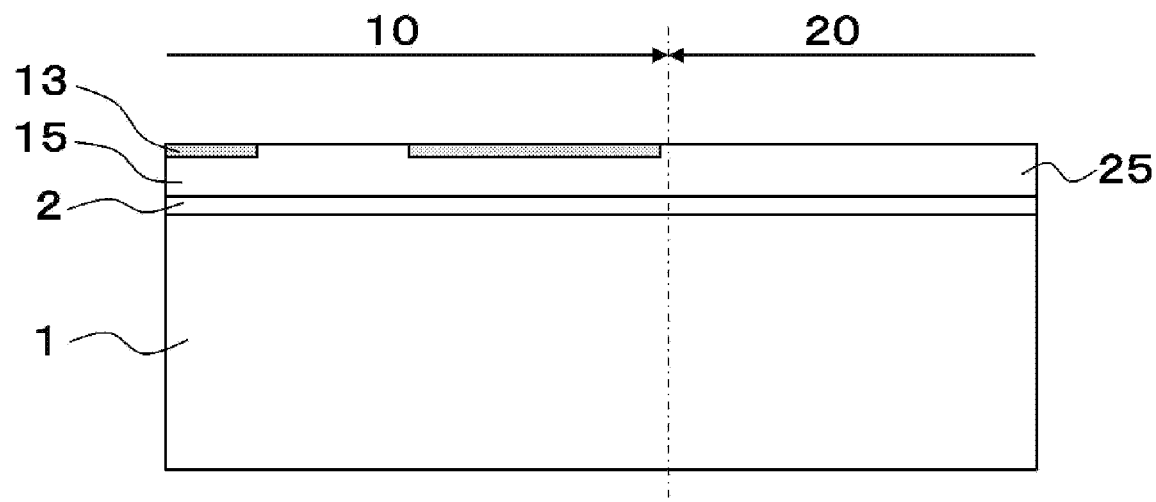

Next, as shown in FIG. 12A, n type impurities are selectively implanted into the first main surface side of the p type base layer 15 in the IGBT region 10 by means of the mask process to form the $n^+$ type source layers 13. The n type impurities to be implanted may be arsenic (As), for example.

Figure 12B:
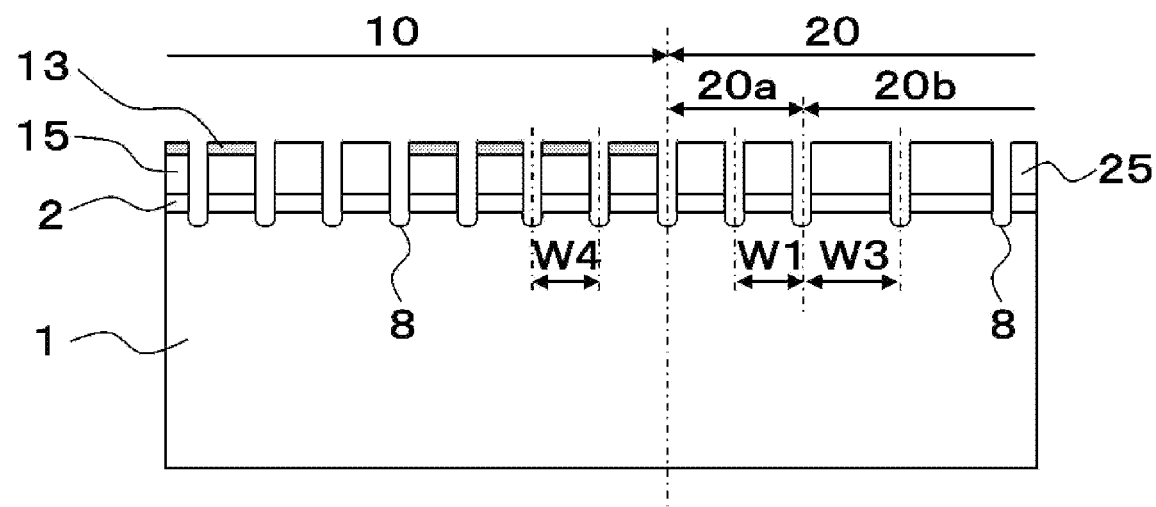

Next, as shown in FIG. 12B, trenches 8 extending from the first main surface side of the semiconductor substrate through the p type base layer 15 and the p type anode layer 25 to the $n^-$ type drift layer 1 are formed. In the IGBT region 10, the trenches 8 extending through the $n^+$ type source layers 13 have side walls constituting part of the $n^+$ type source layers 13. The trenches 8 may be formed by depositing an oxide film of $SiO_2$ and the like on the semiconductor substrate, forming openings in part of the oxide film where the trenches 8 are to be formed by means of a mask process, and etching the semiconductor substrate using the oxide film having the openings as a mask.

In the IGBT region 10, the trenches 8 are disposed at a spacing W4 in a striped pattern. In the first diode region 20a of the diode region 20, the trenches 8 are disposed at the spacing W1 in a striped pattern. In the second diode region 20b of the diode region 20, the trenches 8 are disposed at the spacing W3 in a striped pattern. The spacing W4 in the IGBT region 10 is smaller than the spacing W3 in the second diode region 20b, and may be equal to or different from the spacing W1 in the first diode region 20a. With reference to FIG. 12B, the trenches 8 are formed so that the longitudinal direction thereof is a direction perpendicular to the plane of the figure. Each of the spacings is achieved by designing a mask pattern in the mask process has a predetermined spacing.

Although not shown in FIG. 12B, a trench for the boundary trench gate 23 is formed in a boundary portion between the second diode region 20b and the first diode region 20a adjacent to the second diode region 20b in a direction perpendicular to the plane of the figure. The trench for the boundary trench gate 23 is formed so that the longitudinal direction thereof is a horizontal direction as seen in the figure. The trench for the boundary trench gate 23 is connected to some of the end portions of the trenches 8 having the longitudinal direction extending in the direction perpendicular to the plane of the figure in the diode region 20 shown in FIG. 12B, and is formed integrally therewith in continuous fashion.

Figure 13A:
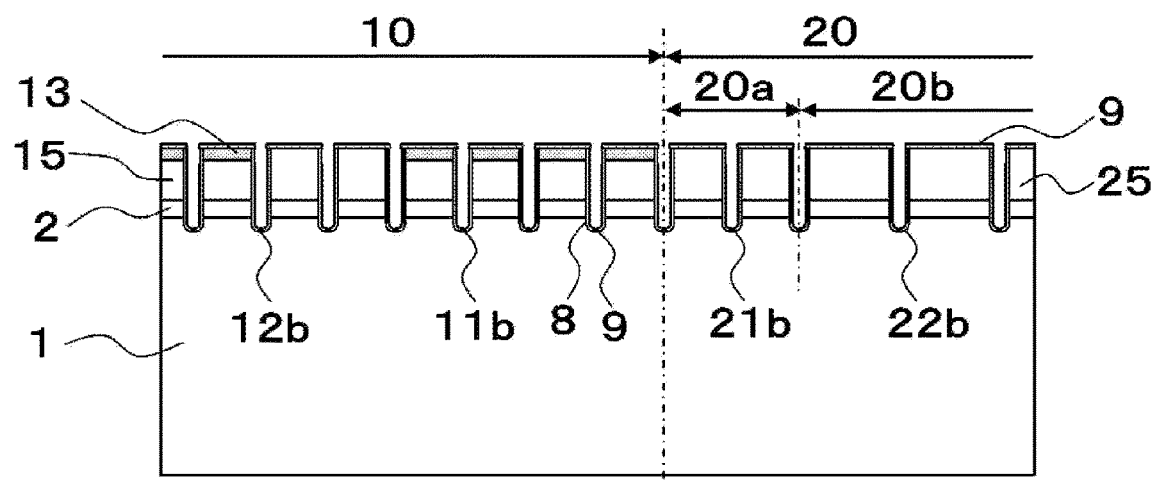

Next, as shown in FIG. 13A, the semiconductor substrate is heated in an oxygen-containing atmosphere, so that oxide films 9 are formed on inner walls of the trenches 8 and on the first main surface of the semiconductor substrate. The oxide films 9 formed on the inner walls of the trenches 8 lying in the IGBT region 10 are the gate trench insulation films 11b of the active trench gates 11 and the dummy trench insulation films 12b of the dummy trench gates 12. The oxide films 9 formed in the trenches 8 lying in the diode region 20 are the first diode trench insulation films 21b, the second diode trench insulation films 22b, and the boundary trench insulation film 23b not shown in FIG. 12B. The oxide films 9 formed on the first main surface of the semiconductor substrate are removed in a subsequent step.

Figure 13B:
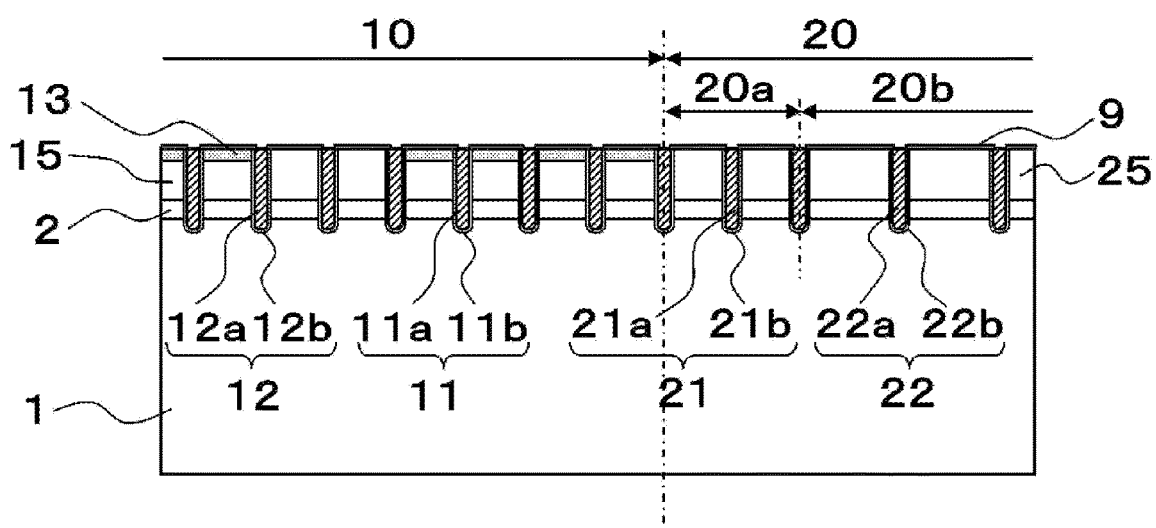

Next, as shown in FIG. 13B, polysilicon doped with n type or p type impurities is deposited by a CVD (chemical vapor deposition) process and the like into the trenches 8 with the oxide films 9 formed on the inner walls thereof to form the gate trench electrodes 11a, the dummy trench electrodes 12a, the first diode trench electrodes 21a, the second diode trench electrodes 22a, and the boundary trench electrode 23a not shown in FIG. 13B.

Figure 14A:
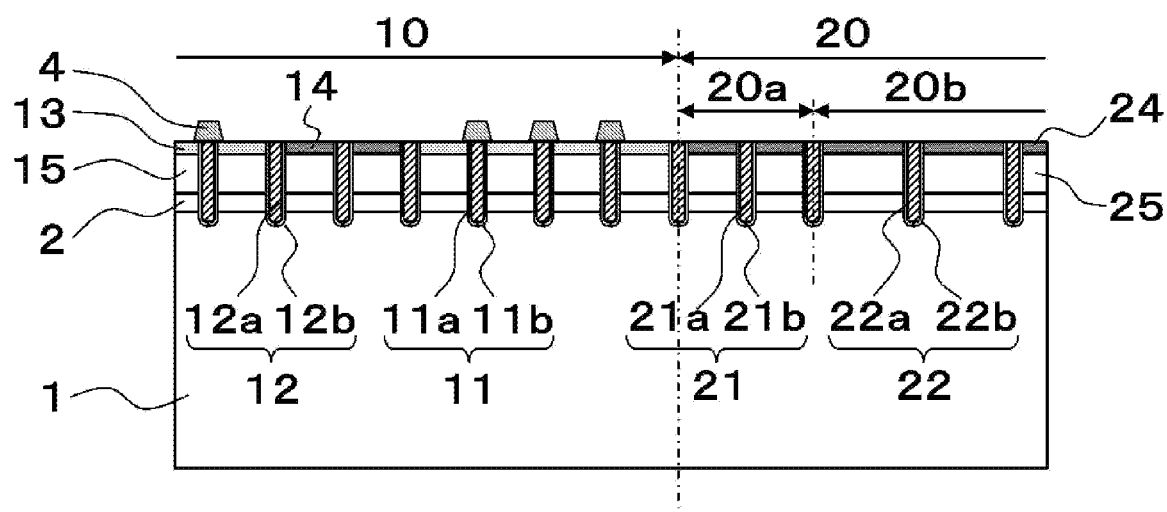

Next, as shown in FIG. 14A, the oxide films 9 formed on the first main surface of the semiconductor substrate are removed, and the interlayer insulation films 4 are formed on the gate trench electrodes 11a of the active trench gates 11 in the IGBT region 10. The interlayer insulation films 4 may be made of $SiO_2$, for example. Then, contact holes are formed in the deposited interlayer insulation films 4 by means of a mask process. The contact holes are formed on the $n^+$ type source layers 13, on the $p^+$ type contact layers 14, on the $p^+$ type contact layers 24, on the dummy trench electrodes 12a, on the first diode trench electrodes 21a, on the second diode trench electrodes 22a, and on the boundary trench electrode 23a not shown in FIG. 14A.

Figure 14B:
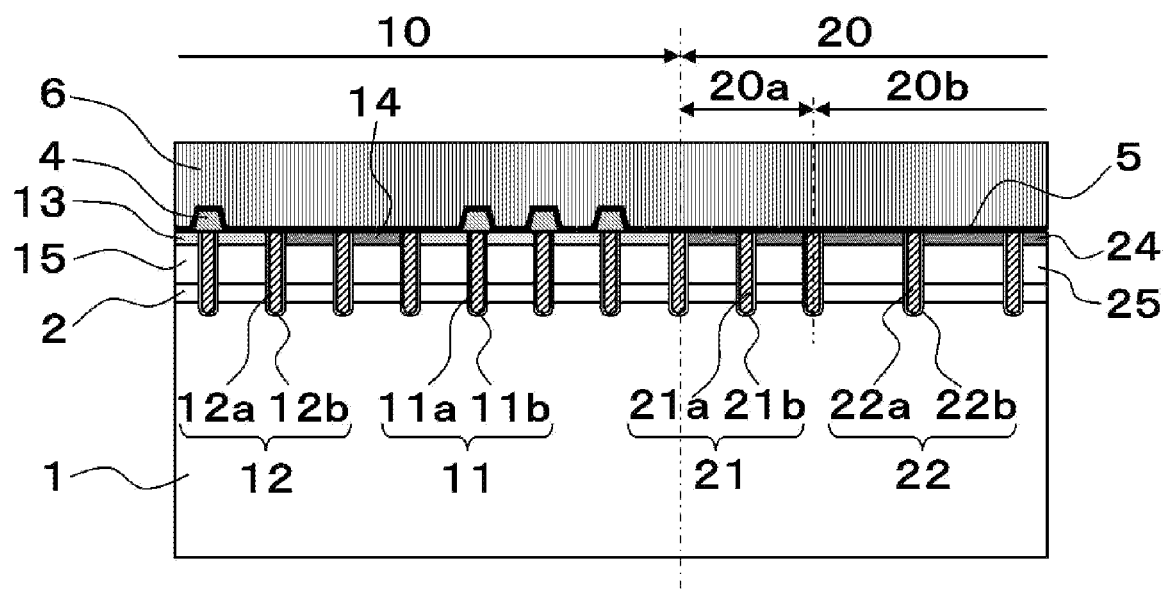

Next, as shown in FIG. 14B, the barrier metal 5 is formed on the first main surface of the semiconductor substrate and on the interlayer insulation films 4. The emitter electrode 6 is further formed on the barrier metal 5. The barrier metal 5 is formed by making titanium nitride into a film by a PDV (physical vapor deposition) or CVD process.

The emitter electrode 6 may be formed by depositing an aluminum-silicon alloy (Al—Si alloy) on the barrier metal 5 by a PVD process such as sputtering or evaporation, for example. Also, a nickel alloy (Ni alloy) may be further formed on the formed aluminum-silicon alloy by electroless plating or electroplating, whereby the emitter electrode 6 is formed. The formation of the emitter electrode 6 by plating facilitates the formation of a thick metal film as the emitter electrode 6. This increases the heat capacity of the emitter electrode 6 to improve the heat resistance thereof. When the nickel alloy is further formed by the plating process after the emitter electrode 6 made of the aluminum-silicon alloy is formed by the PVD process, the plating process for the formation of the nickel alloy may be performed after the processing on the second main surface side of the semiconductor substrate.

Figure 15A:
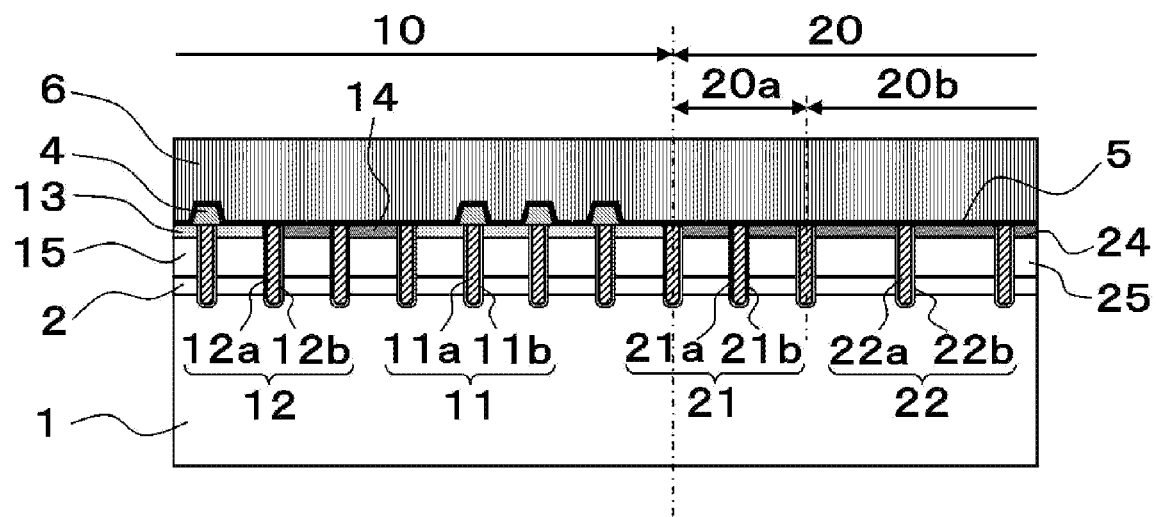

Next, as shown in FIG. 15A, the second main surface side of the semiconductor substrate is ground until the semiconductor substrate is thinned to a designed predetermined thickness. The thickness of the semiconductor substrate after the grinding may be 80 to 200 μm, for example.

Figure 15B:
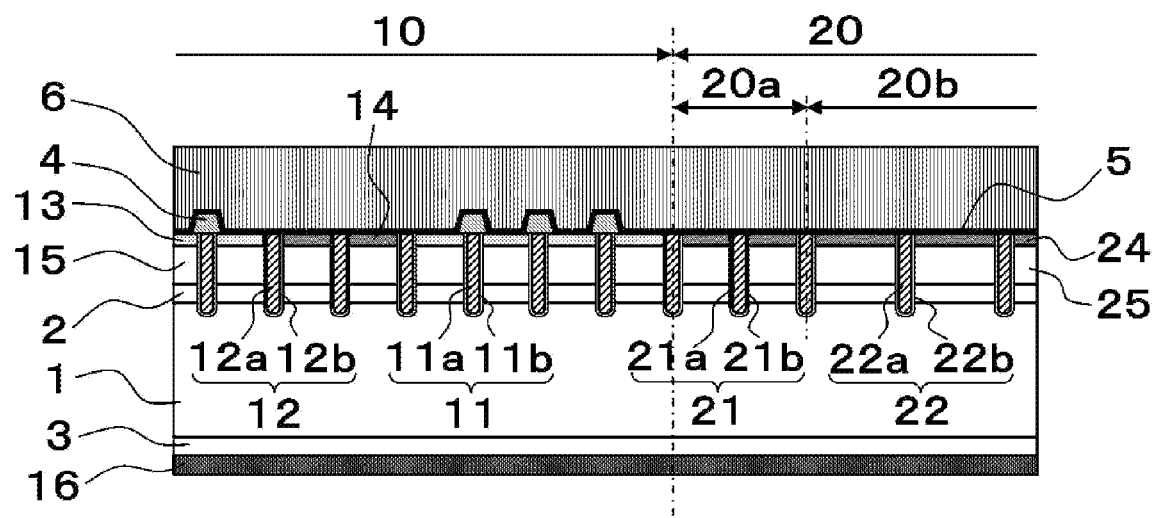

Next, as shown in FIG. 15B, n type impurities are implanted from the second main surface side of the semiconductor substrate to form the n type buffer layer 3. Further, p type impurities are implanted from the second main surface side of the semiconductor substrate to form the $p^+$ type collector layer 16. The n type buffer layer 3 and the $p^+$ type collector layer 16 may be formed in the IGBT regions 10, the diode regions 20, and the termination region 30. Alternatively, the n type buffer layer 3 and the $p^+$ type collector layer 16 may be formed only in the IGBT regions 10 and the diode regions 20.

The n type buffer layer 3 may be formed by implanting phosphorus (P) ions, for example. Alternatively, the n type buffer layer 3 may be formed by implanting protons ($H^+$). Further, the n type buffer layer 3 may be formed by implanting both protons and phosphorus. The protons are implanted to a deep position from the second main surface of the semiconductor substrate at a relatively low acceleration energy. The depth to which protons are implanted is changed relatively easily by changing the acceleration energy. Thus, implanting protons a plurality of times at different acceleration energies for the formation of the n type buffer layer 3 allows the formation of the n type buffer layer 3 wider in the thickness direction of the semiconductor substrate than implanting phosphorus.

The formation of the n type buffer layer 3 made of phosphorus suppresses the punch through of a depletion layer with higher reliability even in the thinned semiconductor substrate because phosphorus is capable of having a higher activation rate as n type impurities than protons. To make the semiconductor substrate further thinner, it is preferable that both protons and phosphorus are implanted to form the n type buffer layer 3. In this case, protons are implanted into a position deeper from the second main surface than phosphorus.

The $p^+$ type collector layer 16 may be formed, for example, by implanting boron (B). The $p^+$ type collector layer 16 is formed also in the termination region 30. The $p^+$ type collector layer 16 in the termination region 30 becomes the $p^+$ type termination collector layer 16a. Ions are implanted from the second main surface side of the semiconductor substrate, and laser annealing is thereafter performed by irradiating the second main surface with a laser. This activates the implanted boron to form the $p^+$ type collector layer 16. At this time, phosphorus implanted in a relatively shallow position from the second main surface of the semiconductor substrate for the formation of the n type buffer layer 3 is activated at the same time. On the other hand, it is necessary to prevent the temperature of the entire semiconductor substrate from increasing to a temperature higher than 380° to 420° C. except in the step for activation of protons after the implantation of protons because protons are activated at a relatively low annealing temperature of 380° to 420° C. Laser annealing, which is capable of increasing the temperature of only the vicinity of the second main surface of the semiconductor substrate, may be used for the activation of n type impurities and p type impurities even after the implantation of protons.

Figure 16A:
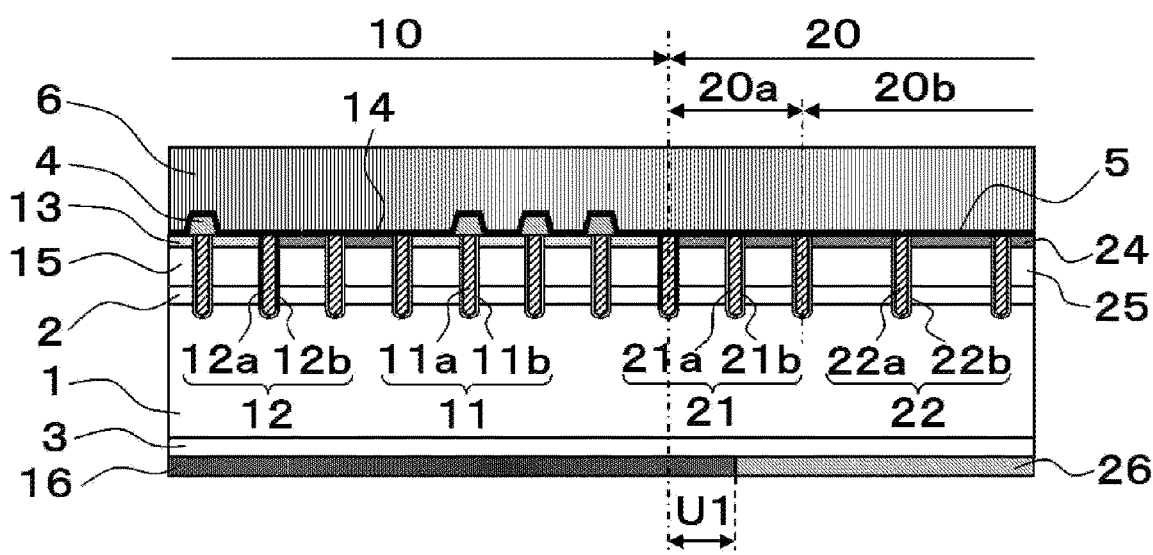

Next, as shown in FIG. 16A, the $n^+$ type cathode layer 26 is formed in the diode region 20. The $n^+$ type cathode layer 26 may be formed, for example, by implanting phosphorus (P). As shown in FIG. 16A, phosphorus is selectively implanted from the second main surface side by a mask process so that the boundary between the $p^+$ type collector layer 16 and the $n^+$ type cathode layer 26 is positioned at the distance U1 from the boundary between the IGBT region 10 and the diode region 20 toward the diode region 20. The amount of n type impurities implanted for the formation of the $n^+$ type cathode layer 26 is greater than the amount of p type impurities implanted for the formation of the $p^+$ type collector layer 16. Although the $p^+$ type collector layer 16 and the $n^+$ type cathode layer 26 are shown in FIG. 16A as having the same depth from the second main surface, the depth of the $n^+$ type cathode layer 26 is not less than that of the $p^+$ type collector layer 16. The region where the $n^+$ type cathode layer 26 is to be formed is required to become an n type semiconductor by implanting n type impurities into a region implanted with p type impurities. For this reason, the concentration of the implanted p type impurities is made higher than that of n type impurities in the entire region where the $n^+$ type cathode layer 26 is to be formed.

Figure 16B:
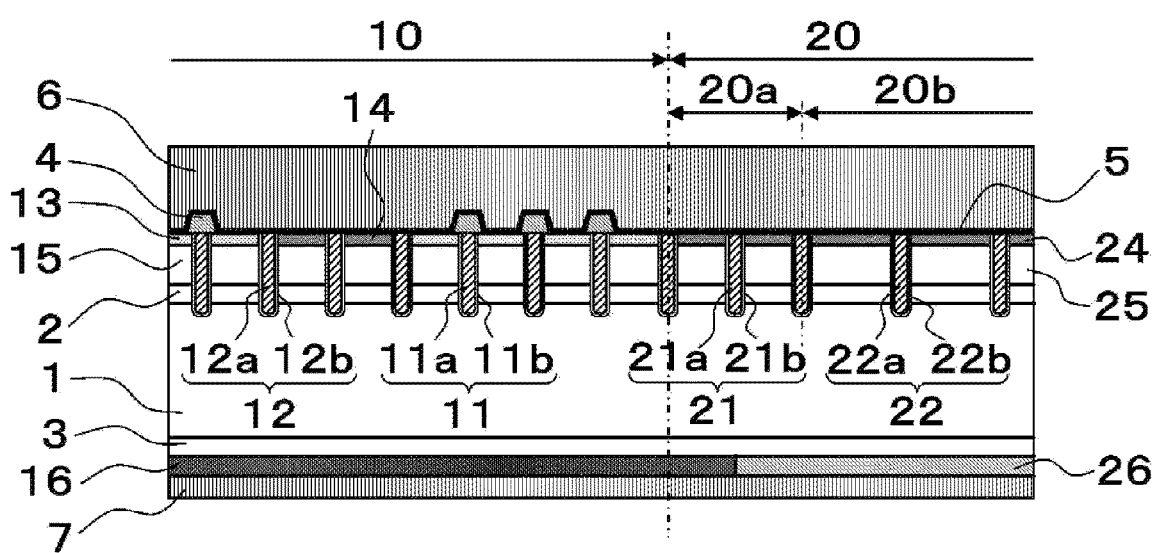

Next, as shown in FIG. 16B, the collector electrode 7 is formed on the second main surface of the semiconductor substrate. The collector electrode 7 is formed on the entire second main surface throughout the IGBT regions 10, the diode regions 20, and the termination region 30. The collector electrode 7 may be formed on the entire second main surface of the n type wafer that is the semiconductor substrate. The collector electrode 7 may be formed by depositing an aluminum-silicon alloy (Al—Si alloy) or titanium (Ti) by a PVD process such as sputtering or evaporation. Alternatively, the collector electrode 7 may be formed by stacking a plurality of layers of metals such as an aluminum-silicon alloy, titanium, nickel, and gold. Further, a metal film may be formed on the metal film formed by the PVD process by electroless plating or electroplating to form the collector electrode 7.

The semiconductor device 100 is produced by the aforementioned steps. A plurality of semiconductor devices 100 are produced in the form of a matrix on a single n type wafer. Laser dicing or blade dicing is performed to cut the wafer into the individual semiconductor devices 100, whereby each of the semiconductor devices 100 is completed.

Next, functions and effects of the semiconductor device 100 according to the first preferred embodiment will be described.

Figure 17:
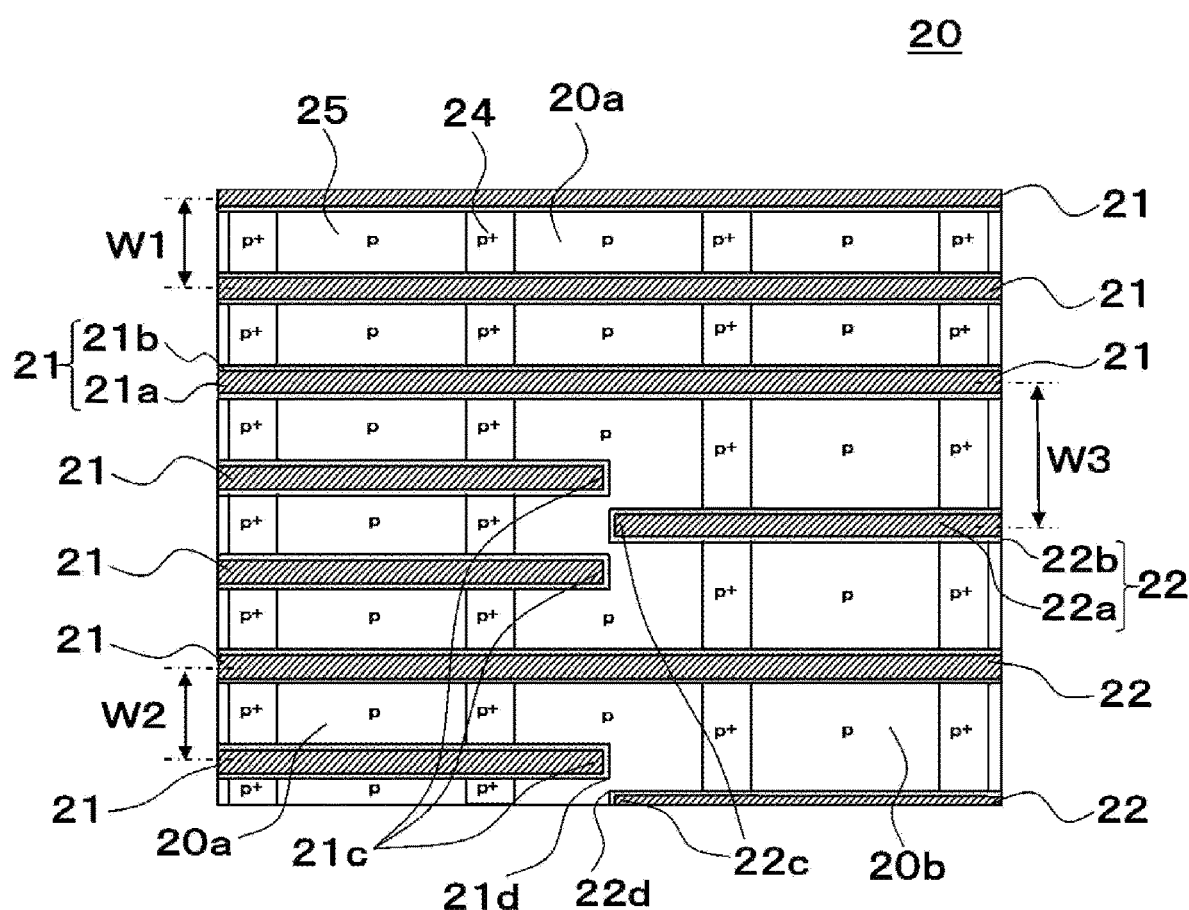
FIG. 17 is a partially enlarged plan view showing a configuration of a diode region of a semiconductor device according to a comparative example.

FIG. 17 is a partially enlarged plan view showing a configuration of a diode region of a semiconductor device according to a comparative example. FIG. 17 corresponds to FIG. 6 showing the configuration of the diode region 20 of the semiconductor device 100 of the first preferred embodiment. The semiconductor device of the comparative example differs from the semiconductor device 100 of the first preferred embodiment in having no boundary trench gate in the boundary portion between the first diode region 20a and the second diode region 20b of the diode region 20, and is similar in configuration to the semiconductor device 100 of the first preferred embodiment except this difference.

The semiconductor device of the comparative example is the semiconductor device disclosed in Japanese Patent Application Laid-Open No. 2018-78230 which is configured such that the second diode region 20b having the spacing W3 is the high electric field cell and the first diode region 20a having a spacing smaller than the spacing W3 surrounds the high electric field cell to ensure avalanche resistance. As shown in FIG. 17, the first diode region 20a and the second diode region 20b differ in spacing from each other. For this reason, the end portions 21c of the first diode trench gates 21 and the end portions 22c of the second diode trench gates 22 are bare in the semiconductor substrate in the boundary portion in which the first diode region 20a and the second diode region 20b are arranged in the direction of extension of the trenches. This results in the presence of corner portions 21d of the first diode trench gates 21 and corner portions 22d of the second diode trench gates 22. Lower end portions of the corner portions 21d and the corner portions 22d are exposed to the n⁻ type drift layer 1 because the first diode trench gates 21 and the second diode trench gates 22 extend from the first main surface of the semiconductor substrate to the n⁻ type drift layer 1. This causes electric field concentration in the lower end portions of the corner portions 21d and the corner portions 22d, so that the first diode trench insulation films 21b and the second diode trench insulation films 22b are liable to deteriorate.

In the semiconductor device 100 of the first preferred embodiment, on the other hand, the end portions 21c of the first diode trench gates 21 and the end portions 22c of the second diode trench gates 22 are connected to the boundary trench gate 23 in the boundary portion between the first diode region 20a and the second diode region 20b, as shown in FIG. 6. Thus, the end portions 21c of the first diode trench gates 21 and the end portions 22c of the second diode trench gates 22 in the diode region 20 have no corner portions exposed to the n⁻ type drift layer 1. As a result, this suppresses the concentration of an electric field in the end portions 21c of the first diode trench gates 21 and in the end portions 22c of the second diode trench gates 22 to suppress the deterioration of the first diode trench insulation films 21b and the second diode trench insulation films 22b.

Second Preferred Embodiment

Figure 18:
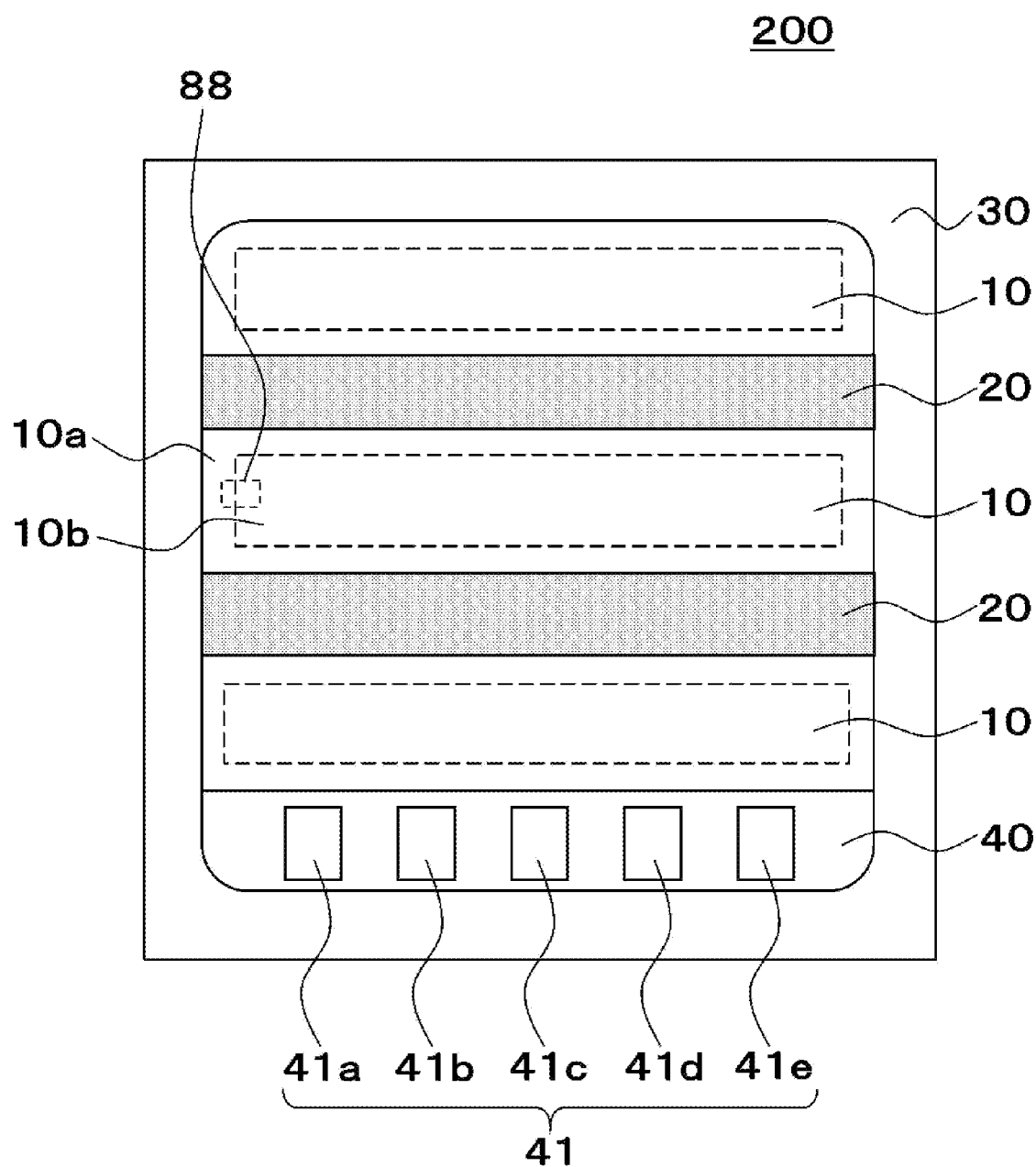
FIG. 18 is a plan view of a semiconductor device according to a second preferred embodiment.

FIG. 18 is a plan view of a semiconductor device 200 according to a second preferred embodiment. The semiconductor device 200 according to the second preferred embodiment differs from the semiconductor device 100 according to the first preferred embodiment in that each of the IGBT regions 10 includes a first IGBT region 10a in which active trench gates or dummy trench gates are disposed at a first spacing and a second IGBT region 10b in which active trench gates or dummy trench gates are disposed at a second spacing greater than the first spacing and in that a boundary trench gate is provided in the boundary portion between the first IGBT region 10a and the second IGBT region 10b. In the second preferred embodiment, parts different from those of the first preferred embodiment will be described, and parts identical with or corresponding to those of the first preferred embodiment will not be described.

Figure 19:
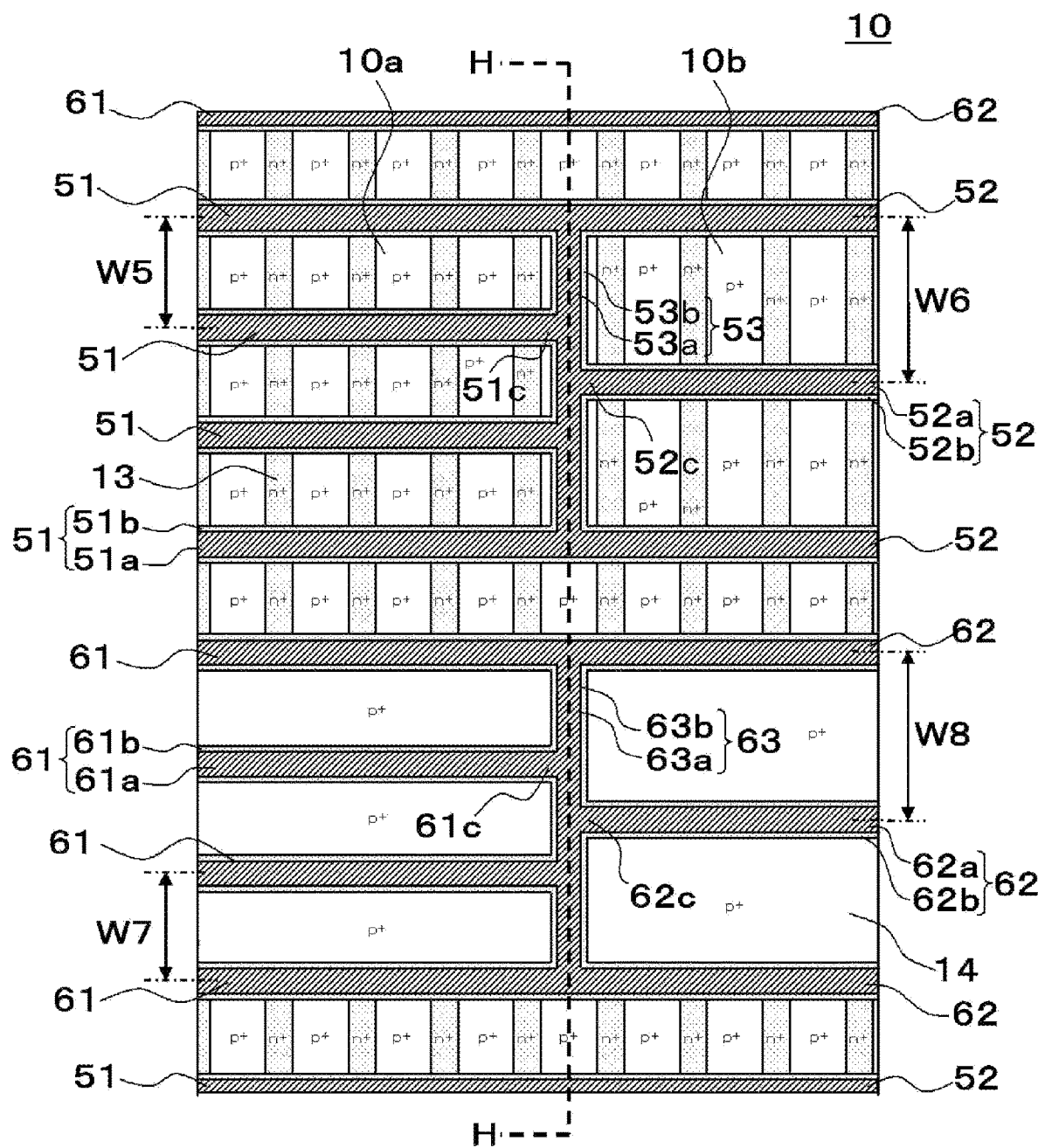
FIG. 19 is a partially enlarged plan view showing a configuration of an IGBT region of the semiconductor device according to the second preferred embodiment.

FIG. 19 is a partially enlarged plan view showing a configuration of an IGBT region 10 of the semiconductor device 200 according to the second preferred embodiment. FIG. 19 is a plan view showing a region surrounded by broken lines 88 in the semiconductor device 200 in FIG. 18 on an enlarged scale. With reference to FIG. 19, a region shown to the left of a broken line H-H as seen in the figure is the first IGBT region 10a, and a region shown to the right of the broken line H-H as seen in the figure is the second IGBT region 10b. In the semiconductor device 200, first active trench gates 51 and first dummy trench gates 61 both of which are first trench gates in the second preferred embodiment are provided in the first IGBT region 10a. Also, second active trench gates 52 and second dummy trench gates 62 both of which are second trench gates in the second preferred embodiment are provided in the second IGBT region 10b.

In the first IGBT region 10a, the first active trench gates 51 adjacent to each other are disposed at a spacing W5, and the first dummy trench gates 61 adjacent to each other are disposed at a spacing W7. The spacing W5 and the spacing W7 may be equal to each other or different from each other. The first active trench gates 51 and the first dummy trench gates 61 extend from the termination region 30 side of the IGBT region 10 toward the middle side of the IGBT region 10. The first active trench gates 51 have respective end portions 51c connected to a boundary trench gate 53. The first dummy trench gates 61 have respective end portions 61c connected to a boundary trench gate 63.

In the second IGBT region 10b, the second active trench gates 52 adjacent to each other are disposed at a spacing W6, and the second dummy trench gates 62 adjacent to each other are disposed at a spacing W8. The spacing W6 and the spacing W8 may be equal to each other or different from each other. Although the spacing W6 is shown as greater than the spacing W5 and the spacing W8 is shown as greater than the spacing W7 in FIG. 19, the spacing W6 may be smaller than the spacing W5 and the spacing W8 may be smaller than the spacing W7. That is, the spacing W6 is required only to be different from the spacing W5, and the spacing W8 is required only to be different from the spacing W7. The second active trench gates 52 have respective end portions 52c connected to the boundary trench gate 53, and extend toward the middle side of the IGBT region 10. Similarly, the second dummy trench gates 62 have respective end portions 62c connected to the boundary trench gate 63, and extend toward the middle side of the IGBT region 10.

Each of the first active trench gates 51 is configured such that a first gate trench electrode 51a is provided in a trench formed in the first main surface of the semiconductor substrate, with a first gate trench insulation film 51b therebetween. Each of the second active trench gates 52 is configured such that a second gate trench electrode 52a is provided in a trench formed in the first main surface of the semiconductor substrate, with a second gate trench insulation film 52b therebetween. Each of the first dummy trench gates 61 is configured such that a first dummy trench electrode 61a is provided in a trench formed in the first main surface of the semiconductor substrate, with a first dummy trench insulation film 61b therebetween. Each of the second dummy trench gates 62 is configured such that a second dummy trench electrode 62a is provided in a trench formed in the first main surface of the semiconductor substrate, with a second dummy trench insulation film 62b therebetween.

Likewise, the boundary trench gate 53 is configured such that a boundary trench electrode 53a is provided in a trench formed in the first main surface of the semiconductor substrate, with a boundary trench insulation film 53b therebetween. The boundary trench gate 63 is configured such that a boundary trench electrode 63a is provided in a trench formed in the first main surface of the semiconductor substrate, with a boundary trench insulation film 63b therebetween. The trench electrodes of the respective trench gates are opposed to the n⁻ type drift layer 1, with the respective insulation films therebetween.

The first gate trench electrodes 51a, the boundary trench electrode 53a, and the second gate trench electrode 52a are electrically connected to each other, and are electrically connected to the gate pad 41c. The first dummy trench electrodes 61a, the boundary trench electrode 63a, and the second dummy trench electrodes 62a are electrically connected to each other, and are electrically connected to the emitter electrode 6.

The semiconductor device 200 includes the first IGBT region 10a in which the active trench gates or the dummy trench gates are disposed at the first spacing in the IGBT region 10 and the second IGBT region 10b in which the active trench gates or the dummy trench gates are disposed at the second spacing in the IGBT region 10. The provision of the trench gates disposed at different spacings in different locations in the IGBT region 10 as in the semiconductor device 200 allows changes in parasitic capacitance such as a gate electrode-collector electrode capacitance (Cgc) and a gate electrode-emitter electrode capacitance (Cge). This increases the design flexibility of the semiconductor device.

In the semiconductor device 200 having the aforementioned configuration, the active trench gates or the dummy trench gates disposed at different spacings are arranged in the direction of extension of the trenches in the IGBT region 10. The active trench gates or the dummy trench gates in the cell region have end portions connected to the boundary trench gate. Thus, the end portions of the active trench gates or the end portions of the dummy trench gates are not exposed to the n⁻ type drift layer 1. As a result, this suppresses the concentration of an electric field in the end portions of the active trench gates or in the end portions of the dummy trench gates to suppress the deterioration of the insulation films provided in the trenches.

In the semiconductor device 100 of the first preferred embodiment, the spacing W3 between the second diode trench gates 22 in the second diode region 20b provided inside the diode region 20 is made greater than the spacing W2 between the first diode trench gates 21 in the first diode region 20a surrounding the second diode region 20b for the purpose of increasing the avalanche resistance. However, the spacing W3 may be made smaller than the spacing W2 in the semiconductor device 100 of the first preferred embodiment for the purpose of changing the parasitic capacitance in the diode region 20, as in the semiconductor device 200 of the second preferred embodiment.

The trench gates different in spacing are provided for both the active trench gates and the dummy trench gates in the semiconductor device 200 of the second preferred embodiment. However, the trench gates different in spacing may be provided for either the active trench gates or the dummy trench gates. Alternatively, the semiconductor device may be configured such that the dummy trench gates are absent in the IGBT region and all of the trench gates in the IGBT region are the active trench gates.

Third Preferred Embodiment

Figure 20:
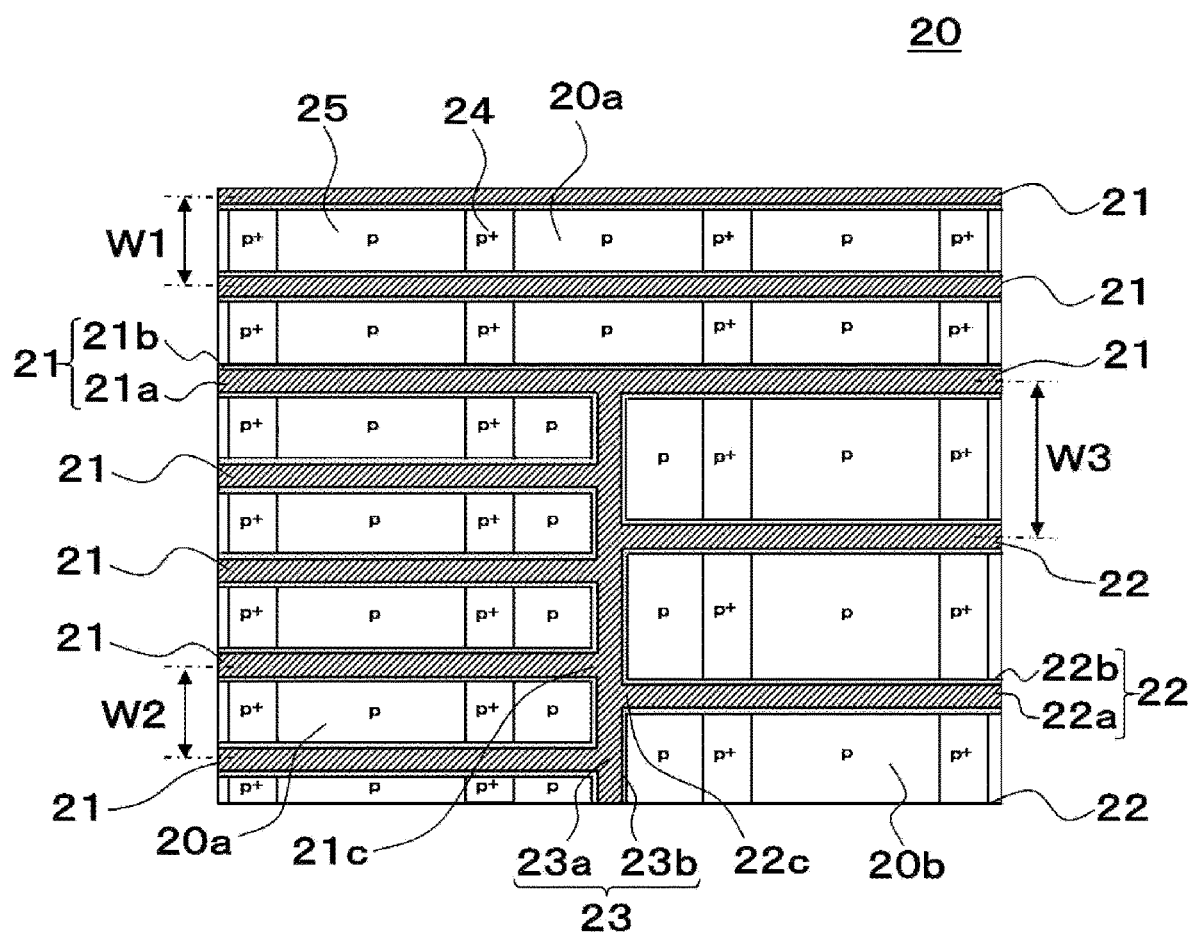
FIG. 20 is a partially enlarged plan view showing a configuration of a diode region of a semiconductor device according to a third preferred embodiment.

FIG. 20 is a partially enlarged plan view showing a configuration of a diode region 20 of a semiconductor device according to a third preferred embodiment. FIG. 20 is a view showing a region surrounded by the broken lines 83 of FIG. 1 on an enlarged scale. The semiconductor device according to the third preferred embodiment is a modification of the semiconductor device 100 of the first preferred embodiment, and differs from that of the first preferred embodiment in that all of the end portions 21c of the first diode trench gates 21 are positioned so as not to be opposed to the end portions 22c of the second diode trench gates 22, with the boundary trench gate 23 therebetween. In the third preferred embodiment, parts different from those of the first preferred embodiment will be described, and parts identical with or corresponding to those of the first preferred embodiment will not be described.

As shown in FIG. 20, in the semiconductor device of the third preferred embodiment, the second diode trench gates 22 which are the second trench gates in the third preferred embodiment are not connected to any of the connection portions between the first diode trench gates 21 which are the first trench gates in the third preferred embodiment and the boundary trench gate 23, so that the connection portions between the first diode trench gates 21 and the boundary trench gate 23 have a T-shaped configuration. Also, the first diode trench gates 21 are not connected to any of the connection portions between the second diode trench gates 22 and the boundary trench gate 23, so that the connection portions between the second diode trench gates 22 and the boundary trench gate 23 have a T-shaped configuration. That is, the boundary trench gate 23 is connected to the first trench gates or the second trench gates in a T-shaped configuration in all of the connection portions to the first trench gates or the second trench gates.

If the end portion 21c of a first diode trench gate 21 and the end portion 22c of a second diode trench gate 22 are opposed to each other, with the boundary trench gate 23 therebetween, the connection portion between these trench gates has a cross-shaped configuration. If the connection portion between the boundary trench gate 23 and another trench gate has a cross-shaped configuration, the connection portion has a trench opening wider than the trench gate width in a location other than the connection portion. For this reason, the trench is liable to be deeper in the connection portion, so that the embeddability of a trench electrode in the trench by CVD is liable to be poor. As a result, insufficient embedding of the trench electrode occurs in some cases in such a cross-shaped trench connection portion.

The semiconductor device according to the third preferred embodiment shown in FIG. 20, in which all of the trench connection portions have a T-shaped configuration, achieves better embeddability of the trench electrodes in the trench connection portions to make the insufficient embedding of the trench electrodes less liable to occur, as compared with the cross-shaped trench connection portions.

The third preferred embodiment shows that all of the trench connection portions in the diode region 20 have a T-shaped configuration. However, the semiconductor device may be configured such that all of the trench connection portions in the IGBT region 10 have a T-shaped configuration.

Fourth Preferred Embodiment

Figure 21:
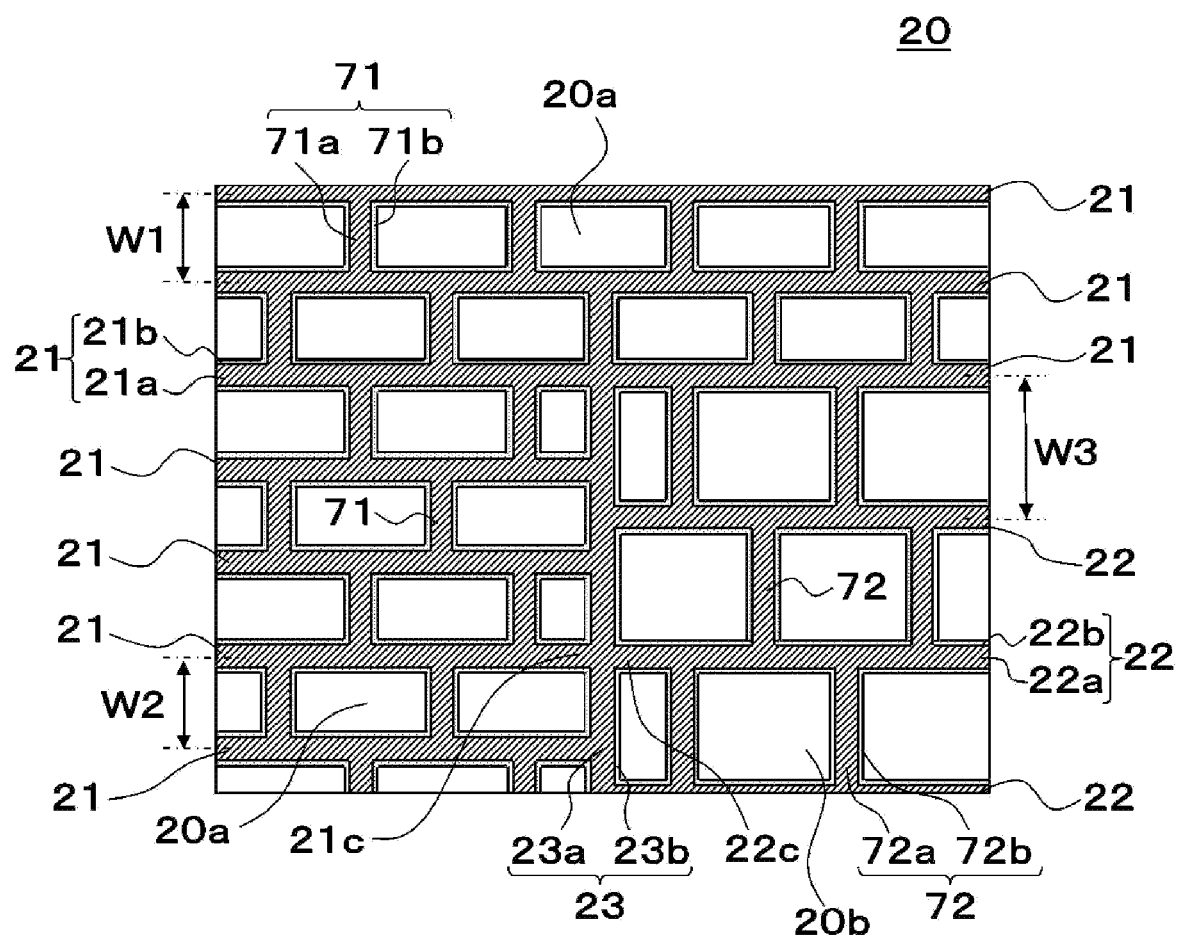
FIG. 21 is a partially enlarged plan view showing a configuration of a diode region of a semiconductor device according to a fourth preferred embodiment.

FIG. 21 is a partially enlarged plan view showing a configuration of a diode region 20 of a semiconductor device according to a fourth preferred embodiment. FIG. 21 is a view showing a region surrounded by the broken lines 83 of FIG. 1 on an enlarged scale. The semiconductor device according to the fourth preferred embodiment is a modification of the semiconductor device 100 of the first preferred embodiment, and differs from that of the first preferred embodiment in that the first diode trench gates 21 adjacent to each other are connected by third trench gates 71 and in that the second diode trench gates 22 adjacent to each other are connected by fourth trench gates 72. In the fourth preferred embodiment, parts different from those of the first preferred embodiment will be described, and parts identical with or corresponding to those of the first preferred embodiment will not be described. The p+ type contact layers 24 and the p type anode layers 25 are not shown in FIG. 21, unlike in FIGS. 6 and 20.

As shown in FIG. 21, the first diode trench gates 21 adjacent to each other are connected by the third trench gates 71 in the first diode region 20a. The third trench gates 71 extend in a direction intersecting the direction of extension of the first diode trench gates 21. The second diode trench gates 22 adjacent to each other are connected by the fourth trench gates 72. The fourth trench gates 72 extend in a direction intersecting the direction of extension of the second diode trench gates 22.

Like other trench gates, each of the third trench gates 71 and each of the fourth trench gates 72 are configured such that a third trench electrode 71a and a fourth trench electrode 72a are provided in trenches formed in the first main surface of the semiconductor substrate, with a third trench insulation film 71b and a fourth trench insulation film 72b therebetween, respectively. The third trench electrodes 71a are electrically connected to the first diode trench electrodes 21a, and the fourth trench electrodes 72a are electrically connected to the second diode trench electrodes 22a.

Also, as shown in FIG. 21, connection portions between the first diode trench gates 21 and the third trench gates 71 have a T-shaped configuration, and connection portions between the second diode trench gates 22 and the fourth trench gates 72 have a T-shaped configuration. As described in the third preferred embodiment, this makes the insufficient embedding of the trench electrodes less liable to occur, as compared with the cross-shaped trench connection portions. It should be noted that the shape of the connection portions between the first diode trench gates 21 or the second diode trench gates 22 and the third trench gates 71 or the fourth trench gates 72 is not limited to the T-shaped configuration but may be a cross-shaped configuration.

The semiconductor device of the fourth preferred embodiment shown in FIG. 21 is capable of improving the breakdown voltage because the first diode trench gates 21 adjacent to each other are connected by the third trench gates 71 and the second diode trench gates 22 adjacent to each other are connected by the fourth trench gates 72.

The fourth preferred embodiment shows that the first trench gates adjacent to each other are connected by the third trench gates and the second trench gates adjacent to each other are connected by the fourth trench gates in the diode region 20. However, the semiconductor device may be configured such that the first trench gates adjacent to each other are connected by the third trench gates and the second trench gates adjacent to each other are connected by the fourth trench gates in the IGBT region 10.

It is also included in the scope of the present disclosure to combine, modify or omit the preferred embodiments, as appropriate.

While the disclosure has been shown and described in detail, the foregoing description is in all aspects illustrative and not restrictive. It is therefore understood that numerous modifications and variations can be devised.

What is claimed is:
1. A semiconductor device comprising:
a cell region including a drift layer of a first conductivity type provided between a first main surface and a second main surface opposite to the first main surface;
a termination region surrounding the cell region and including the drift layer between the first main surface and the second main surface;
a plurality of first trench gates including a plurality of first trench electrodes provided in a plurality of first trenches, with an insulation film therebetween, in opposed relation to the drift layer, the first trenches being provided to extend along the first main surface from a first end side of the cell region toward a second end side thereof opposite to the first end side, the first trenches being disposed adjacent to each other at a first spacing;
a boundary trench gate including a boundary trench electrode provided in a boundary trench, with an insulation film therebetween, in opposed relation to the drift layer, the boundary trench being provided to extend in a direction intersecting a direction of extension of the first trenches, the boundary trench being connected to end portions of the respective first trenches, the boundary trench electrode being electrically connected to the first trench electrodes; and
a plurality of second trench gates including a plurality of second trench electrodes provided in a plurality of second trenches, with an insulation film therebetween, in opposed relation to the drift layer, each of the second trenches having an end portion connected to the boundary trench, the second trenches being provided to extend toward the second end side of the cell region, the second trenches being disposed adjacent to each other at a second spacing different from the first spacing, the second trench electrodes being electrically connected to the boundary trench electrode.

2. The semiconductor device according to claim 1, wherein
the second spacing is greater than the first spacing.

3. The semiconductor device according to claim 1, wherein
the termination region includes:
a termination well layer of a second conductivity type provided between the first main surface and the drift layer; and
a termination collector layer of the second conductivity type provided between the second main surface and the drift layer.

4. The semiconductor device according to claim 1, wherein
the cell region includes:
an IGBT region having a base layer of the second conductivity type provided between the first main surface and the drift layer, and a collector layer of the second conductivity type provided between the second main surface and the drift layer; and
a diode region having an anode layer of the second conductivity type provided between the first main surface and the drift layer, and a cathode layer of the first conductivity type provided between the second main surface and the drift layer.

5. The semiconductor device according to claim 4, wherein
the first trench gates, the second trench gates, and the boundary trench gate are provided in the diode region.

6. The semiconductor device according to claim 4, wherein the first trench gates, the second trench gates, and the boundary trench gate are provided in the IGBT region.

7. The semiconductor device according to claim 1, wherein the first trench gates have respective end portions positioned so as not to be opposed to end portions of the second trench gates, with the boundary trench gate therebetween.

8. The semiconductor device according to claim 1, wherein the boundary trench gate is connected to the first trench gates or the second trench gates in a T-shaped configuration in all connection portions to the first trench gates or the second trench gates.

9. The semiconductor device according to claim 1, further comprising:

a third trench gate including a third trench electrode provided in a third trench, with an insulation film therebetween, in opposed relation to the drift layer, the third trench being provided to extend in a direction intersecting a direction of extension of the first trenches, the third trench connecting adjacent ones of the first trenches; and a fourth trench gate including a fourth trench electrode provided in a fourth trench, with an insulation film therebetween, in opposed relation to the drift layer, the fourth trench being provided to extend in a direction intersecting a direction of extension of the second trenches, the fourth trench connecting adjacent ones of the second trenches.

* * * * *